United States Patent
Do et al.

(10) Patent No.: US 12,382,752 B2
(45) Date of Patent: Aug. 5, 2025

(54) METHOD FOR MANUFACTURING LIGHT-EMITTING ELEMENT USING FIRST AND SECOND SUPPORTS, AND DISPLAY DEVICE COMPRISING LIGHT-EMITTING ELEMENT

(71) Applicant: SAMSUNG DISPLAY CO., LTD., Yongin-si (KR)

(72) Inventors: Young Rag Do, Seoul (KR); Hye Lim Kang, Seoul (KR); Hoo Keun Park, Cheongju-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 748 days.

(21) Appl. No.: 17/423,455

(22) PCT Filed: Nov. 25, 2019

(86) PCT No.: PCT/KR2019/016245
§ 371 (c)(1),
(2) Date: Jul. 15, 2021

(87) PCT Pub. No.: WO2020/149513
PCT Pub. Date: Jul. 23, 2020

(65) Prior Publication Data
US 2022/0069162 A1  Mar. 3, 2022

(30) Foreign Application Priority Data
Jan. 15, 2019  (KR) .......................... 10-2019-0005421

(51) Int. Cl.
*H10H 20/819*  (2025.01)
*H10H 20/01*  (2025.01)
(Continued)

(52) U.S. Cl.
CPC .......... *H10H 20/819* (2025.01); *H10H 20/01* (2025.01); *H10H 20/831* (2025.01); *H10H 29/142* (2025.01)

(58) Field of Classification Search
CPC ..... H01L 33/20; H01L 33/0005; H01L 33/38; H01L 33/156
See application file for complete search history.

(56) References Cited

U.S. PATENT DOCUMENTS 7,964,884 B2  6/2011  Lee
7,999,279 B2  8/2011  Lee
(Continued)

FOREIGN PATENT DOCUMENTS

CN  107749437  * 3/2018
CN  110927079  * 3/2020
(Continued)

OTHER PUBLICATIONS

Extended European Search Report dated Sep. 14, 2022 issued in corresponding Application No. 19909834.4, 8 pages.
(Continued)

*Primary Examiner* — Sheng-Bai Zhu
(74) *Attorney, Agent, or Firm* — Womble Bond Dickinson (US) LLP

(57) ABSTRACT

A method for manufacturing a light-emitting element, and a display device including a light-emitting element are provided. A method for manufacturing a light-emitting element includes: preparing a base substrate and at least one semiconductor rod formed on the base substrate; a first separating including forming a first element structure, which includes a semiconductor rod of the at least one semiconductor rod and a first support formed around the outer surface of the semiconductor rod, and separating the first element structure from the base substrate; removing at least a part of the first
(Continued)

support so as to partially expose the semiconductor rod, and forming a second element structure which includes the exposed semiconductor rod and a second support around the outer surface of the first support; and a second separating including separating the semiconductor rod from the second element structure.

16 Claims, 27 Drawing Sheets

(51) Int. Cl.
    *H10H 20/831*      (2025.01)
    *H10H 29/14*      (2025.01)

(56) References Cited

U.S. PATENT DOCUMENTS

| | | |
|---|---|---|
| 8,008,101 B2 | 8/2011 | Lee |
| 8,039,861 B2 | 10/2011 | Lee |
| 8,143,640 B2 | 3/2012 | Lee |
| 8,274,094 B2 | 9/2012 | Lee |
| 9,112,112 B2 | 8/2015 | Do et al. |
| 9,190,590 B2 | 11/2015 | Shibata et al. |
| 2008/0006836 A1 | 1/2008 | Lee |
| 2010/0124797 A1 | 5/2010 | Lee |
| 2010/0213494 A1 | 8/2010 | Lee |
| 2011/0169039 A1 | 7/2011 | Lee |
| 2011/0278628 A1 | 11/2011 | Lee |
| 2012/0146081 A1 | 6/2012 | Lee |
| 2012/0326181 A1 | 12/2012 | Shibata et al. |
| 2013/0027623 A1 | 1/2013 | Negishi et al. |
| 2013/0221385 A1* | 8/2013 | Shibata .................. H01L 33/64 438/33 |
| 2014/0145237 A1 | 5/2014 | Do et al. |
| 2017/0138549 A1 | 5/2017 | Do et al. |
| 2017/0250168 A1 | 8/2017 | Do et al. |
| 2018/0166429 A1 | 6/2018 | Chong et al. |

FOREIGN PATENT DOCUMENTS

| | | | |
|---|---|---|---|
| EP | 0042122 | * | 12/1981 |
| KR | 10-2006-0059783 A | | 6/2006 |
| KR | 20110040676 | * | 4/2011 |
| KR | 10-2012-0122159 A | | 11/2012 |
| KR | 10-2012-0122160 | | 11/2012 |
| KR | 10-2015-0098246 A | | 8/2015 |
| KR | 20160059576 | * | 5/2016 |
| KR | 10-2018-0072909 | | 7/2018 |
| WO | WO 2012148231 | * | 11/2012 |
| WO | WO 2019168187 | * | 9/2019 |

OTHER PUBLICATIONS

International Search Report for corresponding PCT/KR2019/016245, dated Mar. 10, 2020, 6 pages.

* cited by examiner

METHOD FOR MANUFACTURING LIGHT-EMITTING ELEMENT USING FIRST AND SECOND SUPPORTS, AND DISPLAY DEVICE COMPRISING LIGHT-EMITTING ELEMENT

CROSS-REFERENCE TO RELATED APPLICATIONS

This application is a U.S. National Phase Patent Application of International Patent Application Number PCT/KR2019/016245, filed on Nov. 25, 2019, which claims priority to Korean Patent Application Number 10-2019-0005421, filed on Jan. 15, 2019 in the Korean Intellectual Property Office, the entire contents of each of which are incorporated herein by reference.

TECHNICAL FIELD

Aspects of embodiments of the present invention relate to a method of manufacturing a light-emitting element, and a display device including a light-emitting element.

BACKGROUND ART

The importance of display devices is increasing with the development of multimedia. Accordingly, various types of display devices, such as an organic light emitting display (OLED) device, a liquid crystal display (LCD) device, and the like have been used.

A device for displaying an image of a display device includes a display panel, such as an organic light emitting display panel or a liquid crystal display panel. Among the above, the light emitting display panel may include a light-emitting element. For example, a light emitting diode (LED) includes an organic light emitting diode (OLED) using an organic material as a fluorescent material, an inorganic light emitting diode using an inorganic material as a fluorescent material, and the like.

An inorganic light emitting diode using an inorganic semiconductor as a fluorescent material has an advantage of having durability even in a high temperature environment, and having high blue light efficiency compared to an organic light emitting diode. Further, even in a manufacturing process pointed out as a limitation of a conventional inorganic light emitting diode device, a transfer method using a dielectrophoresis (DEP) method has been developed. Accordingly, research on an inorganic light emitting diode having superior durability and efficiency compared to an organic light emitting diode is ongoing.

SUMMARY

According to an aspect of embodiments of the present invention, a method of manufacturing a light-emitting element with fewer crystal defects and a smooth shape at both ends of a semiconductor crystal as a method of manufacturing a light-emitting element including a semiconductor crystal is provided.

Further, according to another aspect of embodiments of the present invention, a display device including light-emitting elements manufactured through the above-described method is provided, wherein the light-emitting elements have a reduced deviation in length and, thus, quality of the light-emitting elements disposed in pixels is uniform or substantially uniform.

However, aspects of embodiments of the present invention are not limited to the above-mentioned aspects, and other aspects and problems overcome which are not mentioned may be apparently understood from the following descriptions by those skilled in the art.

Technical Solution

According to one or more embodiments, a method of manufacturing a light-emitting element comprises preparing a base substrate and at least one semiconductor rod arranged on the base substrate; a first separating including forming a first element structure including a semiconductor rod of the at least one semiconductor rod and a first support formed around an outer surface of the semiconductor rod, and separating the first element structure from the base substrate; removing at least a part of the first support so as to partially expose the semiconductor rod, and forming a second element structure including the exposed semiconductor rod and a second support around an outer surface of the first support; and a second separating including separating the semiconductor rod from the second element structure.

The semiconductor rod may have a shape in which a first end portion contacts the base substrate, and a second end portion extends in a first direction perpendicular to the base substrate.

The first support may have an extending thickness in the first direction greater than an extending length of the semiconductor rod in the first direction, and may be formed to cover the second end portion of the semiconductor rod.

In the first separating, the first element structure may include a pattern portion formed in a surface separated from the base substrate and having at least a partial recessed region, and the semiconductor rod may have the first end portion exposed at the pattern portion.

The first support may include a first region defined as a region overlapping the semiconductor rod in the first direction and a second region defined as a region other than the first region.

The forming the second element structure may include etching at least a part of the first support formed in the second region in the first direction to form a hole, and forming the second support partially surrounding the first support and the semiconductor rod exposed along the hole.

The hole may expose at least a part of a side surface of the semiconductor rod; and a depth of the hole measured in the first direction may be less than or equal to the thickness of the first support.

The second support may contact the first end portion and at least the exposed part of the side surface of the semiconductor rod.

The second separating step may include etching the second element structure in a direction perpendicular to the first direction to expose the second end portion of the semiconductor rod, and removing the second support.

The removing the second support may include dissolving the second support in a solvent, and volatilizing and removing the dissolved second support.

The at least one semiconductor rod may include a plurality of semiconductor rods formed on the base substrate to be spaced apart from each other in a second direction different from the first direction.

The second element structure may include the plurality of semiconductor rods, wherein the semiconductor rods separated from the second dement structure may satisfy the following Equation 1:

$$0 \le (\sigma_L/L_{mean}) \times 100(\%) \le 20,$$

where, $\sigma_L$ is a standard deviation of lengths of light-emitting elements, and $L_{mean}$ is an average of the lengths of the light-emitting elements.

A hardness of the first support may be greater than a hardness of the second support.

The first support may include polydimethylsiloxane (PDMS), and the second support may include polymethylmethacrylate (PMMA).

The first dement structure may further include a first sub support around the outer surface of the first support, and the first sub support may include a thermoplastic resin.

The first dement structure may further include an auxiliary layer on a surface of the first support.

According to one or more embodiments, a display device comprises a base layer; a first electrode and a second electrode disposed on the base layer to be spaced apart from each other; and one or more light-emitting elements disposed between the first electrode and the second electrode, wherein each of the light-emitting elements has a shape extending in a direction parallel to the base layer and is connected to at least one of the first electrode and the second electrode, and the light-emitting elements disposed between the first electrode and the second electrode satisfy the following Equation 1:

$$0 \leq (\sigma_L/L_{mean}) \times 100(\%) \leq 20,$$

where, $\sigma_L$ is a standard deviation of lengths of the light-emitting elements, and $L_{mean}$ is an average of the lengths of the light-emitting elements.

Each of the light-emitting elements may include a first conductive semiconductor, a second conductive semiconductor having a polarity different from that of the first conductive semiconductor, and an active layer between the first conductive semiconductor and the second conductive semiconductor.

The first conductive semiconductor, the active layer, and the second conductive semiconductor may be arranged in the direction parallel to the base layer.

Each of the light-emitting elements may have an extending length in the one direction in a range from 2 μm to 5 μm and an aspect ratio in a range from 1.2 to 100.

Further details of the above and other embodiments are included in the following detailed description and the accompanying drawings.

Advantageous Effects

A method of manufacturing a light-emitting element according to one or more embodiments includes a task of forming supports having different hardnesses and separating a semiconductor crystal. Accordingly, manufactured light-emitting elements can each have a smooth shape with few crystal defects at both end portions of the semiconductor crystal.

Further, since a display device according to one or more embodiments includes the light-emitting elements manufactured through the above-described method, a deviation in length between the light-emitting elements can be reduced, and, thus, quality of the light-emitting elements disposed in pixels can be enhanced.

However, aspects and effects according to embodiments of the present invention are not limited to those described above, and more various aspects and effects are included in the specification.

DETAILED DESCRIPTION

The present invention will now be described more fully herein with reference to the accompanying drawings, in which some embodiments of the invention are shown. The present invention may, however, be embodied in different forms and should not be construed as limited to the embodiments set forth herein. Rather, these embodiments are provided so that this disclosure will be thorough and complete, and will fully convey the scope of the invention to those skilled in the art.

It is also be understood that when a layer is referred to as being "on" another layer or substrate, it can be directly on the other layer or substrate, or one or more intervening layers may also be present. The same reference numbers indicate the same or like components throughout the specification.

It is to be understood that, although the terms "first," "second," etc. may be used herein to describe various elements, these elements should not be limited by these terms. These terms are used to distinguish one element from another element. For instance, a first element discussed below could be termed a second element without departing from the teachings of the present invention. Similarly, the second element could also be termed the first element.

Hereinafter, some embodiments will be described with reference to the accompanying drawings.

Figure 1:
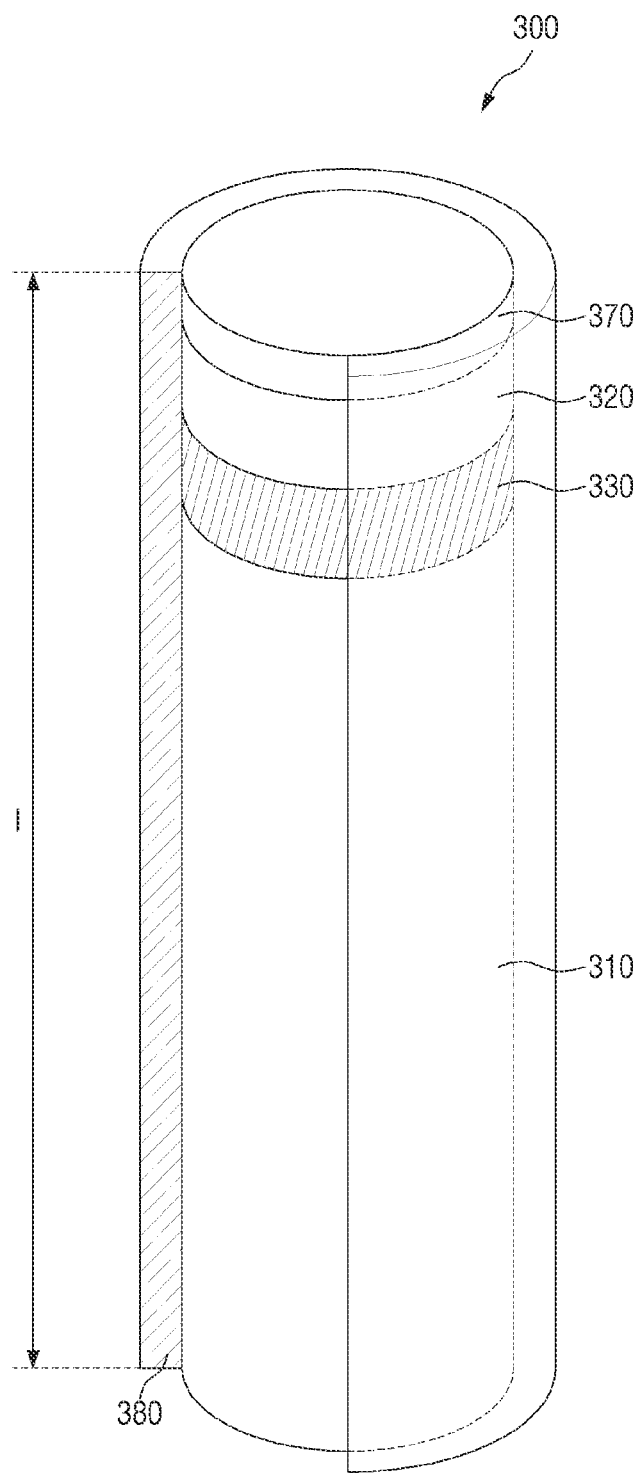
FIG. 1 is a schematic view of a light-emitting element according to an embodiment.

FIG. 1 is a schematic view of a light-emitting element according to an embodiment.

A light-emitting element 300 may be a light emitting diode, and, in an embodiment, the light-emitting element 300 may be an inorganic light emitting diode made of an inorganic material having a micrometer or nanometer unit size. In the case in which the light-emitting element 300 is an inorganic light emitting diode, when an electric field is formed between two electrodes facing each other in a certain direction, the inorganic light emitting diode may be aligned between the two electrodes formed with polarities. The light-emitting element 300 may emit light in a certain wavelength band by receiving an electrical signal (e.g., a predetermined electrical signal) from the electrodes.

The light-emitting element 300 may include a semiconductor crystal doped with an arbitrary conductive (for example, p-type or n-type) impurity. The semiconductor crystal may receive an electrical signal applied from an external power source and emit the electrical signal as light in a certain wavelength band.

Referring to FIG. 1, the light-emitting element 300 according to an embodiment may include a first conductive semiconductor 310, a second conductive semiconductor 320, an active layer 330, and an insulating film 380. Further, the light-emitting element 300 according to an embodiment may further include at least one conductive electrode layer 370. In FIG. 1, a case in which the light-emitting element 300 further includes one conductive electrode layer 370 is shown, but the present invention is not limited thereto. In some cases, the light-emitting element 300 may include a larger number of conductive electrode layers 370 or the conductive electrode layer 370 may be omitted. The description of the light-emitting element 300 which will be described later may be equally applied even when the number of conductive electrode layers 370 is changed or another structure is further included.

Meanwhile, in this specification, although "first," "second," and the like are used to refer to respective elements, they are used to simply distinguish the elements, and do not necessarily refer to the elements. That is, components defined as "first," "second," and the like are not components which are necessarily restricted to a specific structure or position, and other numbers may be assigned in some cases. Accordingly, numbers assigned to the elements may be described through the drawings and the following descriptions, and a first element which will be mentioned later may also be a second element within the technical spirit of the present invention.

The light-emitting element 300 may have a shape extending in a direction. The light-emitting element 300 may have a shape such as a nanorod shape, a nanowire shape, a nanotube shape, or the like. In an embodiment, the light-emitting element 300 may have a cylindrical shape or a rod shape. However, the shape of the light-emitting element 300 is not limited thereto, and may have any of various shapes, such as a regular hexahedron, a rectangular parallelepiped, a hexagonal column, and the like. A plurality of semiconductors included in the light-emitting element 300 which will be described later may have a sequentially disposed structure or stacked structure along the direction.

The light-emitting element 300 according to an embodiment may emit light in a certain wavelength band. In an embodiment, light emitted from the active layer 330 may be blue light having a central wavelength band in a range from 450 nm to 495 nm. However, it should be understood that the central wavelength band of the blue light is not limited to the above-described range, and may include all wavelength ranges which may be recognized as blue in the art. Further, light emitted from the active layer 330 of the light-emitting element 300 is not limited thereto, and may be green light having a central wavelength band in a range from 495 nm to 570 nm or red light having a central wavelength band in a range from 620 nm to 750 nm.

In a description of the light-emitting element 300 with reference to FIG. 1, the first conductive semiconductor 310 may be, for example, an n-type semiconductor having a first conductivity type. For example, when the light-emitting element 300 emits light in a blue wavelength band, the first conductive semiconductor 310 may include a semiconductor material having a chemical formula of $In_xAl_yGa_{1-x-y}N$ ($0 \leq x \leq 1$, $0 \leq y \leq 1$, and $0 \leq x+y \leq 1$). For example, the semiconductor material may be one or more among InAlGaN, GaN, AlGaN, InGaN, AlN, and InN which are doped with an n-type dopant. The first conductive semiconductor 310 may be doped with a first conductive dopant, and, for example, the first conductive dopant may include Si, Ge, Sn, or the like. In an embodiment, the first conductive semiconductor 310 may be n-GaN doped with Si that is an n-type dopant. A length of the first conductive semiconductor 310 may be in a range from 1.5 μm to 5 μm, but is not limited thereto.

The second conductive semiconductor 320 is disposed on the active layer 330, which will be described later. The second conductive semiconductor 320 may be, for example, a p-type semiconductor having a second conductivity type. For example, when the light-emitting element 300 emits light in a blue wavelength band or green wavelength band, the second conductive semiconductor 320 may include a semiconductor material having a chemical formula of $In_xAl_yGa_{1-x-y}N$ ($0 \leq x \leq 1$, $0 \leq y \leq 1$, and $0 \leq x+y \leq 1$). For example, the semiconductor material may be one or more among InAlGaN, GaN, AlGaN, InGaN, AlN, and InN which are doped with a p-type dopant. The second conductive semiconductor 320 may be doped with a second conductive dopant, and, for example, the second conductive dopant may include Mg, Zn, Ca, Se, Ba, or the like. In an embodiment, the second conductive semiconductor 320 may be p-GaN doped with Mg that is a p-type dopant. A length of the second conductive semiconductor 320 may be in a range from 0.08 μm to 0.25 μm, but is not limited thereto.

The drawings illustrate that the first conductive semiconductor 310 and the second conductive semiconductor 320 may be configured as a single layer, but the present invention is not limited thereto. In some cases, depending on a material of the active layer 330, the first conductive semiconductor 310 and the second conductive semiconductor 320 may further include a larger number of layers, such as a clad layer or tensile strain barrier reducing (TSBR) layer.

The active layer 330 is disposed between the first conductive semiconductor 310 and the second conductive semiconductor 320. The active layer 330 may include a material having a single quantum well structure or multiple quantum well structure. When the active layer 330 includes the material having the multiple quantum well structure, it may be a structure in which a plurality of quantum layers and a plurality of well layers may be alternately stacked. The active layer 330 may emit light by combination of an electron-hole pair according to an electrical signal applied through the first conductive semiconductor 310 and the second conductive semiconductor 320. For example, when the active layer 330 emits light in a blue wavelength band, the active layer 330 may include a material such as AlGaN, AlInGaN, or the like. When the active layer 330 has a structure in which the quantum layers and the well layers are alternately stacked as the multiple quantum well structure, the quantum layer may include a material such as AlGaN, AlInGaN, or the like, and the well layer may include a material such as GaN, AlInN, or the like. In an embodiment, as described above, the active layer 330 includes AlGaInN as the quantum layer and AlInN as the well layer, and thus may emit blue light having a central wavelength band in a range of 450 nm to 495 nm.

However, embodiments are not limited thereto, and the active layer 330 may have a structure in which semiconductor materials having large band gap energy and semiconductor materials having small band gap energy are alternately stacked, and may also include other group III to V semiconductor materials according to a wavelength band of the emitted light. The light emitted from the active layer 330 is not limited to light in the blue wavelength band, and, in some cases, light in a red or green wavelength band may be emitted. A length of the active layer 330 may be in a range from 0.05 μm to 0.25 μm, but is not limited thereto.

In an embodiment, the light emitted from the active layer 330 may be emitted not only to an outer surface of the light-emitting element 300 in a longitudinal direction, but also to both side surfaces of the light-emitting element 300. Directionality of the light emitted from the active layer 330 is not limited to one direction.

The conductive electrode layer 370 may be an ohmic contact electrode. However, the conductive electrode layer 370 is not limited thereto, and, in an embodiment, may be a Schottky contact electrode. The conductive electrode layer 370 may be disposed on the second conductive semiconductor 320, but is not limited thereto.

The conductive electrode layer 370 may include a conductive metal. For example, the conductive electrode layer 370 may include at least one of aluminum (Al), titanium (Ti), indium (In), gold (Au), silver (Ag), indium tin oxide (ITO), indium zinc oxide (IZO), and indium tin-zinc oxide (ITZO). Further, the conductive electrode layer 370 may include a semiconductor material doped with an n-type or p-type dopant. The conductive electrode layer 370 may include the same material or different materials, but is not limited thereto.

In an embodiment, the insulating film 380 is disposed to surround the outer surfaces of the above-described plurality of semiconductors. In an embodiment, the insulating film 380 may be disposed to surround at least an outer surface of the active layer 330, and may extend in a direction in which the light-emitting element 300 extends. The insulating film 380 may perform a function of protecting the members. For example, the insulating film 380 may be formed to surround side surfaces of the members, and both ends of the light-emitting element 300 in the longitudinal direction may be exposed. However, the insulating film 380 is not limited thereto.

The insulating film 380 may include a material having insulating properties, for example, silicon oxide ($SiO_x$), silicon nitride ($SiN_x$), silicon oxynitride ($SiO_xN_y$), aluminum nitride (AlN), aluminum oxide ($Al_2O_3$), or the like. Accordingly, it is possible to prevent or substantially prevent an electrical short circuit which may occur when the active layer 330 comes into direct contact with the electrodes through which the electrical signal is transmitted to the light-emitting element 300. In addition, since the insulating film 380 protects the outer surface of the light-emitting element 300 including the active layer 330, it is possible to prevent or substantially prevent a decrease in luminous efficiency.

The drawings illustrate that the insulating film 380 may be formed to extend in the longitudinal direction of the light-emitting element 300 to cover the first conductive semiconductor 310 to the conductive electrode layer 370, but the insulating film 380 is not limited thereto. For example, the insulating film 380 may cover outer surfaces of only some of the conductive semiconductors and the active layer 330, or may cover only a part of the outer surface of the conductive electrode layer 370 to expose a part of the outer surface of the conductive electrode layer 370.

A thickness of the insulating film 380 may be in a range from 10 nm to 1.0 μm, but is not limited thereto. In an embodiment, the thickness of the insulating film 380 may be 40 nm.

Further, in some embodiments, an outer surface of the insulating layer 380 may be surface-treated. When a display device 1 is manufactured, the light-emitting elements 300 may be sprayed onto the electrodes in a state of being dispersed in an ink (e.g., a predetermined ink) to be aligned. Here, in order to maintain a state in which the light-emitting elements 300 are dispersed without being aggregated with other light-emitting elements 300 adjacent thereto in the ink, the surface of the insulating film 380 may be treated to be hydrophobic or hydrophilic.

In an embodiment, each of the light-emitting elements 300 may have a length l in an range from 1 μm to 10 μm or 2 μm to 5 μm, and, in an embodiment, may have a length of about 4 μm. Further, in an embodiment, a diameter of the light-emitting element 300 may be in a range from 300 nm to 700 nm, and an aspect ratio of the light-emitting element 300 may be 1.2 to 100. However, the present invention is not limited thereto, and the plurality of light-emitting elements 300 included in the display device 1 may have different diameters according to a composition difference of the active layer 330. In an embodiment, the diameter of the light-emitting element 300 may be about 500 nm.

The light-emitting element 300 according to one embodiment may be manufactured by an epitaxial growth method. The light-emitting element 300 may be manufactured by a method of forming a seed crystal layer on a substrate and depositing a predetermined semiconductor material to grow a semiconductor crystal. The light-emitting element 300 grown on the substrate may be physically separated from the substrate or may be separated using a chemical lift off (CLO) method.

In an embodiment, the semiconductor crystal may be separated by a method of physically scraping the semiconductor crystal off from the substrate or cutting a lower end portion of the semiconductor crystal. In this case, a size or length of the separated semiconductor crystal may not be uniform, and defects may occur in a region where the semiconductor crystal is separated. In order to prevent or substantially prevent such damage to the semiconductor crystal, a method of chemically separating the semiconductor crystal by further disposing a sacrificial layer on the substrate is used. However, in the chemical separation method, since the sacrificial layer may not be completely removed, or the semiconductor crystal may be thermally or chemically denatured during a separation process, a loss of optical characteristics may occur.

A method of manufacturing the light-emitting element 300 according to an embodiment may include a step of forming a support surrounding the semiconductor crystal grown on the substrate. Since the support is separated together with the semiconductor crystal on the substrate, it is possible to prevent or substantially prevent damage to the semiconductor crystal and manufacture the light-emitting element 300 having a uniform or substantially uniform size and length.

Figure 2:
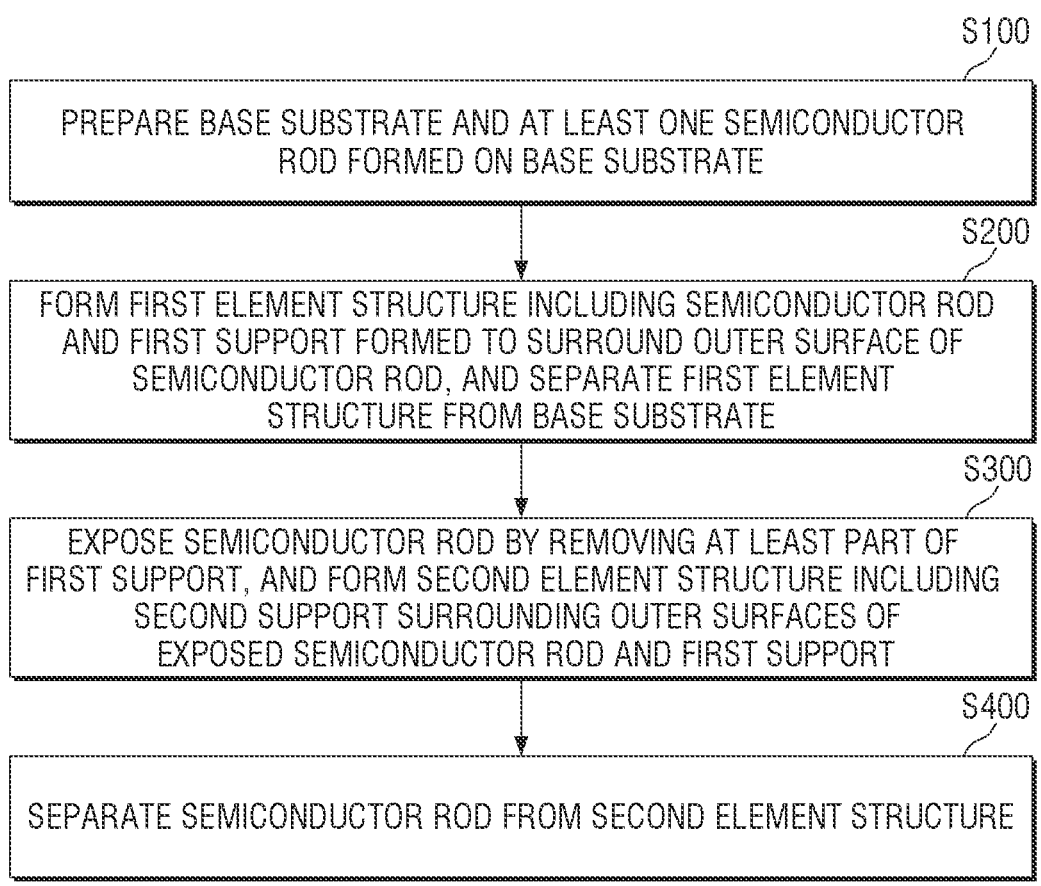
FIG. 2 is a flowchart illustrating a method of manufacturing a light-emitting element according to an embodiment.
Figure 3:
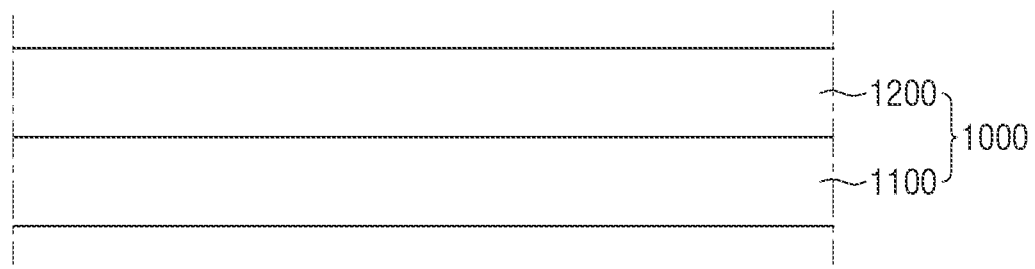
FIGS. 3 to 20 are schematic views illustrating a method of manufacturing the light-emitting element according to an embodiment.

FIG. 2 is a flowchart illustrating a method of manufacturing a light-emitting element according to an embodiment.

Referring to FIG. 2, a method of manufacturing the light-emitting element 300 according to an embodiment includes a step, or task, of preparing a base substrate 1000 and at least one semiconductor rod ROD formed on the base substrate 1000 (S100), a first separating step, or task, of forming a first element structure 5100 including the semiconductor rod ROD and a first support 5110 formed to surround an outer surface of the semiconductor rod ROD, and separating the first element structure 5100 from the base substrate 1000 (S200), a step, or task, of partially exposing the semiconductor rod ROD by removing at least a part of the first support 5110, and forming a second element structure 5200 including a second support 5210 surrounding the exposed outer surface of the semiconductor rod ROD (S300), and a second separating step, or task, (S400) of separating the semiconductor rod ROD from the second element structure 5200.

According to an embodiment, the method of manufacturing the light-emitting element 300 includes a step, or task, of forming a first support and a second support which prevent or substantially prevent damage to the semiconductor crystal to separate the semiconductor crystal. Accordingly, the manufactured light-emitting elements 300 may have the uniform or substantially uniform size and length, and surfaces of which both end portions are smooth may be formed. Herein, the method of manufacturing the light-emitting element 300 according to an embodiment will be described in further detail with reference to FIGS. 3 to 20.

FIGS. 3 to 20 are schematic views illustrating the method of manufacturing the light-emitting element according to an embodiment. FIGS. 3 to 9 illustrate a step, or task, of forming the semiconductor rod ROD (shown in FIG. 9), and FIGS. 10 to 20 illustrate a step, or task, of separating the semiconductor rod ROD from the base substrate 1000 to manufacture the light-emitting element 300.

First, referring to FIGS. 3 to 9, the base substrate 1000 including a lower substrate 1100 and a buffer material layer 1200 formed on the lower substrate 1100 is prepared (S100).

The lower substrate 1100 may include a transparent substrate, such as a sapphire ($Al_2O_3$) substrate and glass. However, the lower substrate 1100 is not limited thereto, and may be formed of a conductive substrate, such as GaN, SiC, ZnO, Si, GaP, or GaAs, or may be a substrate formed with a conductive material layer, such as GaAs, on a transparent substrate. Herein, in order to manufacture the light-emitting element 300 described above with reference to FIG. 1, a case in which the base substrate 1100 is a sapphire substrate ($Al_2O_3$) will be described as an example. A thickness of the base substrate 1100 is not particularly limited, but, for example, the base substrate 1100 may have a thickness in a range from 400 μm to 1500 μm.

In a step which will be described later, a plurality of conductive semiconductor layers are formed on the lower substrate 1000. The plurality of conductive semiconductor layers grown by an epitaxial method may be grown by forming a seed crystal and depositing a crystal material thereon. Here, the conductive semiconductor layer may be formed by an electron beam deposition method, a physical vapor deposition (PVD) method, a chemical vapor deposition (CVD) method, a plasma laser deposition (PLD) method, a dual-type thermal evaporation method, a sputtering method, a metal-organic chemical vapor deposition (MOCVD) method, or the like, and, in an embodiment, may be formed by metal-organic chemical vapor deposition (MOCVD). However, the method is not limited thereto.

A precursor material for forming the plurality of conductive semiconductor layers is not particularly limited within a range that can be normally selected to form a target material. For example, the precursor material may be a metal precursor including an alkyl group such as a methyl group or an ethyl group. For example, the precursor material may be a compound such as trimethyl gallium ($Ga(CH_3)_3$), trimethyl aluminum ($Al(CH_3)_3$), and triethyl phosphate (($C_2H_5)_3PO_4$), but is not limited thereto. Herein, a method of forming the plurality of conductive semiconductor layers, process conditions, and the like will be omitted in the description, and a sequence of the manufacturing method and a stacked structure of the light-emitting element 300 will be described in further detail.

The buffer material layer 1200 is formed on the lower substrate 1100. The drawings illustrate that one layer of the buffer material layer 1200 is stacked, but the present invention is not limited thereto, and a plurality of layers may be formed.

For example, the buffer material layer 1200 may include an undoped semiconductor, and may include substantially the same material as the first conductive semiconductor 310, but may include a material which is not doped with an n-type or p-type dopant. In an embodiment, the buffer material layer 1200 may include at least one of InAlGaN, GaN, AlGaN, GaInP, AlN, and InN which is not doped and includes nitrogen (N). However, although not limited thereto, in order to manufacture the light-emitting element 300 of FIG. 1, in an embodiment, the buffer material layer 1200 may be GaN. Although not shown in the drawings, a larger number of layers may be disposed on the buffer material layer 1200. For example, a sacrificial layer which functions as an etching stopper may be further disposed on the buffer material layer 1200.

Figure 4:
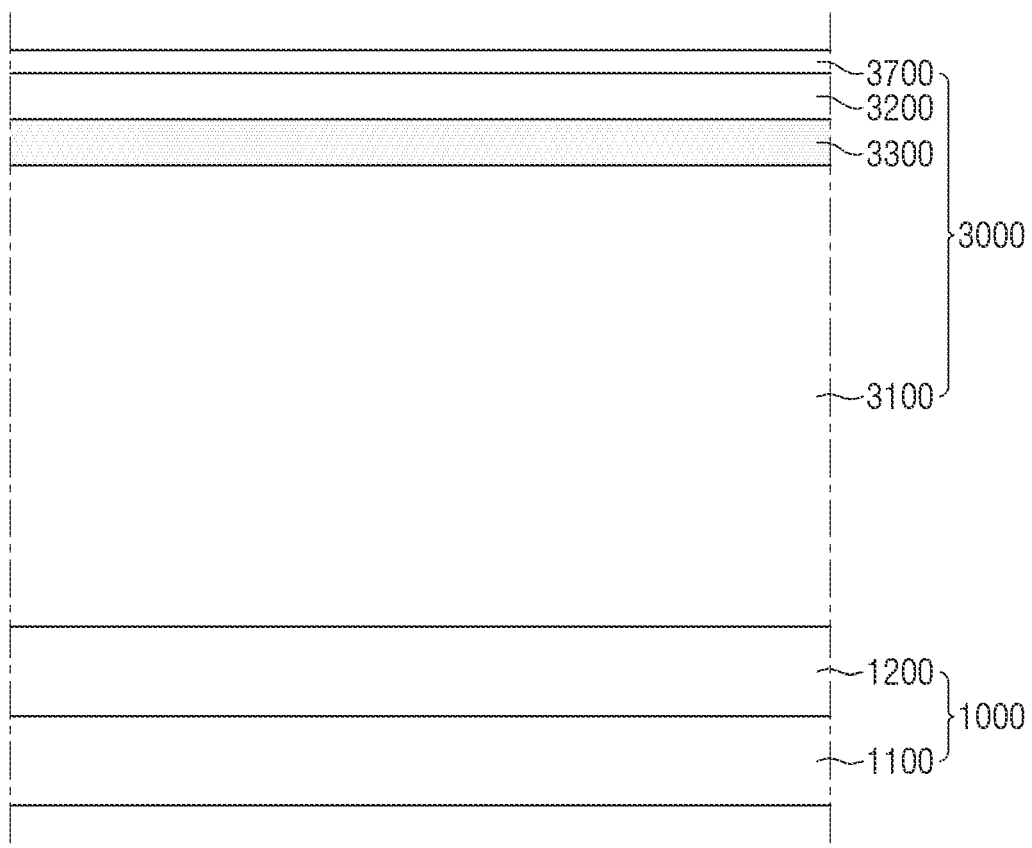

Subsequently, referring to FIG. 4, a semiconductor structure 3000 including a first conductive semiconductor layer 3100, an active material layer 3300, a second conductive semiconductor layer 3200, and a conductive electrode material layer 3700 are formed on the buffer material layer 1200 of the base substrate 1000.

As described above, the plurality of semiconductor layers included in the semiconductor structure 3000 may be formed by performing a general process. The first conductive semiconductor layer 3100, the active material layer 3300, the second conductive semiconductor layer 3200, and the conductive electrode material layer 3700 of the semiconductor structure 3000 may respectively correspond to the first conductive semiconductor 310, the active layer 330, the second conductive semiconductor 320, and the conductive electrode layer 370 of the light-emitting element 300. That is, the plurality of layers of the semiconductor structure 3000 may include the same materials as the plurality of semiconductors of the light-emitting element 300. The semiconductor structure 3000 may be partially etched in a step which will be described later to form a semiconductor rod ROD (shown in FIG. 11).

Subsequently, referring to FIGS. 5 to 7, at least a part of the semiconductor structure 3000 is etched in a direction perpendicular to the base substrate 1000 to form a semiconductor crystal 3000'.

A step, or task, of forming the semiconductor crystal 3000' by vertically etching the semiconductor structure 3000 may include an etching process which may be generally performed. For example, the step of forming the semiconductor crystal 3000' by etching the semiconductor structure 3000 may include a step of forming an etching mask layer 1610, 1620 and an etching pattern layer 1700 on the semiconductor structure 3000, a step of etching the semiconductor structure 3000 according to a pattern of the etching pattern layer 1700, and a step of removing the etching mask layer 1610, 1620 and the etching pattern layer 1700.

Figure 5:
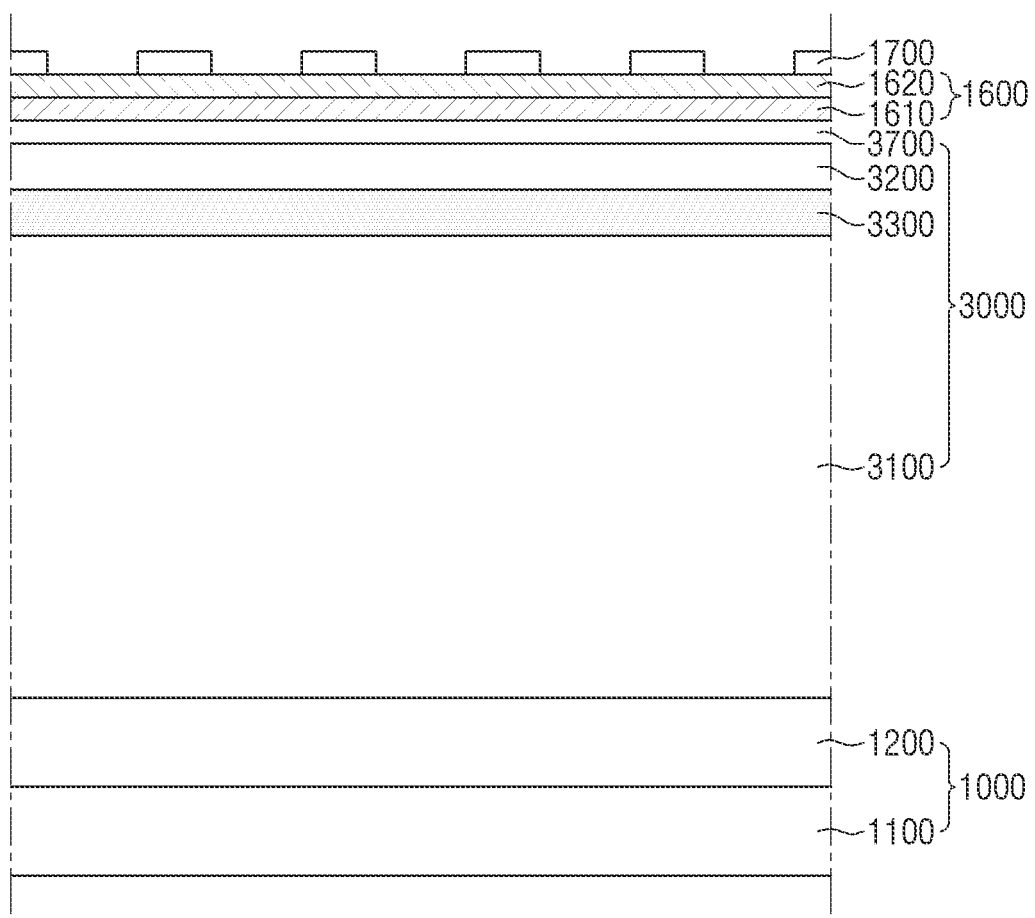

First, as shown in FIG. 5, the etching mask layer 1610, 1620 may serve as a mask for continuous etching of the semiconductor structure 3000. The etching mask layer 1610, 1620 may include a first etching mask layer 1610 including an insulating material and a second etching mask layer 1620 including a metal.

An oxide or nitride may be used as the insulating material included in the first etching mask layer 1610. For example, the insulating material may be silicon oxide ($SiO_x$), silicon nitride ($SiN_x$), silicon oxynitride ($SiO_xN_y$), or the like. A thickness of the first etching mask layer 1610 may be in a range from 0.5 μm to 1.5 μm, but is not limited thereto.

The second etching mask layer 1620 is not particularly limited as long as it is a general material capable of performing the role of a mask for continuous etching of the semiconductor structure 3000. For example, the second etching mask layer 1620 may include chromium (Cr), aluminum (Al), or the like. A thickness of the second etching mask layer 1620 may be in a range from 30 nm to 150 nm, but is not limited thereto.

In the etching pattern layer 1700 formed on the etching mask layer 1610, 1620, one or more nanopatterns may be disposed to be spaced apart from each other. The etching pattern layer 1700 may serve as a mask for continuous etching of the semiconductor structure 3000. The etching pattern layer 1700 is not particularly limited as long as it is formed by a method capable of forming a pattern by including a polymer, a polystyrene sphere, a silica sphere, or the like.

For example, when the etching pattern layer 1700 includes a polymer, a general method capable of forming a pattern using the polymer may be employed. For example, the etching pattern layer 1700 including the polymer may be formed by a method such as photolithography, e-beam lithography, nanoimprint lithography, or the like.

Structures, shapes, and spaced intervals of the etching pattern layers 1700 may be related to the shape of the light-emitting element 300 which is finally manufactured. For example, when the etching pattern layers 1700 have circular patterns spaced apart from each other, the light-emitting element 300 manufactured by vertically etching the semiconductor structure 3000 may have a cylindrical shape.

In the etching pattern layer 1700, other nanopatterns may be disposed around one nanopattern to surround the one nanopattern. In an embodiment, six different nanopatterns are arranged to surround an outer surface of the one nanopattern centered therein, and the six nanopatterns may be divided and disposed at a same interval. However, the nanopatterns are not limited thereto.

Further, the interval between a plurality of nanopatterns may be larger than a diameter of each nanopattern. For example, the interval between the plurality of nanopatterns may be in a range of 2 to 4 times or about 3 times the diameter of each nanopattern. Further, the plurality of nanopatterns may have different diameters.

In an embodiment, the etching pattern layer 1700 may be formed by nanoimprint lithography, and the nanopattern of the etching pattern layer 1700 may include a nanoimprint resin. The resin may include a fluorinated monomer, an acrylate monomer, a dipentaerythritol hexaacrylate, a dipropylene glycol diacrylate, a polyethylene glycol) phenyletheracrylate, butylated hydroxy toluene (BHT), 1-hydroxy-cyclohexylphenylketone (Irgacure 184), or the like, but is not limited thereto.

Subsequently, referring to FIGS. 6 and 7, the semiconductor structure 3000 is etched along the nanopatterns of the etching pattern layer 1700 to form the semiconductor crystal 3000'. The step, or task, of forming the semiconductor crystal 3000' may include a first etching step of vertically etching a region where the nanopatterns of the etching pattern layer 1700 are spaced apart from each other to etch the etching mask layer 1610, 1620 and the conductive electrode material layer 3700 and form a first hole h1, a step of removing the etching pattern layer 1700, a second etching step of etching from the second conductive semiconductor layer 3200 to the first conductive semiconductor layer 3100 in a direction perpendicular to the base substrate 1000 along the first hole h1 to form a second hole h2, and a step of removing the etching mask layer 1610, 1620.

The method of forming the first hole h1 and the second hole h2 may be performed by a general method. For example, the etching process may include a dry etching method, a wet etching method, a reactive ion etching (RIE) method, an inductively coupled plasma-reactive ion etching (ICP-RIE) method, or the like. In the case of the dry etching method, anisotropic etching is possible, and thus may be suitable for forming the holes h1 and h2 by vertical etching. When using the above-described etching method, an etchant may include $Cl_2$ or $O_2$. However, the etchant is not limited thereto.

In some embodiments, the semiconductor structure 3000 may be etched by combining a dry etching method and a wet etching method. For example, first, a sidewall etched in a depth direction through the dry etching method, and then etched through the wet etching method, which is an isotropic etching method, may be disposed on a plane perpendicular to the surface.

Figure 6:
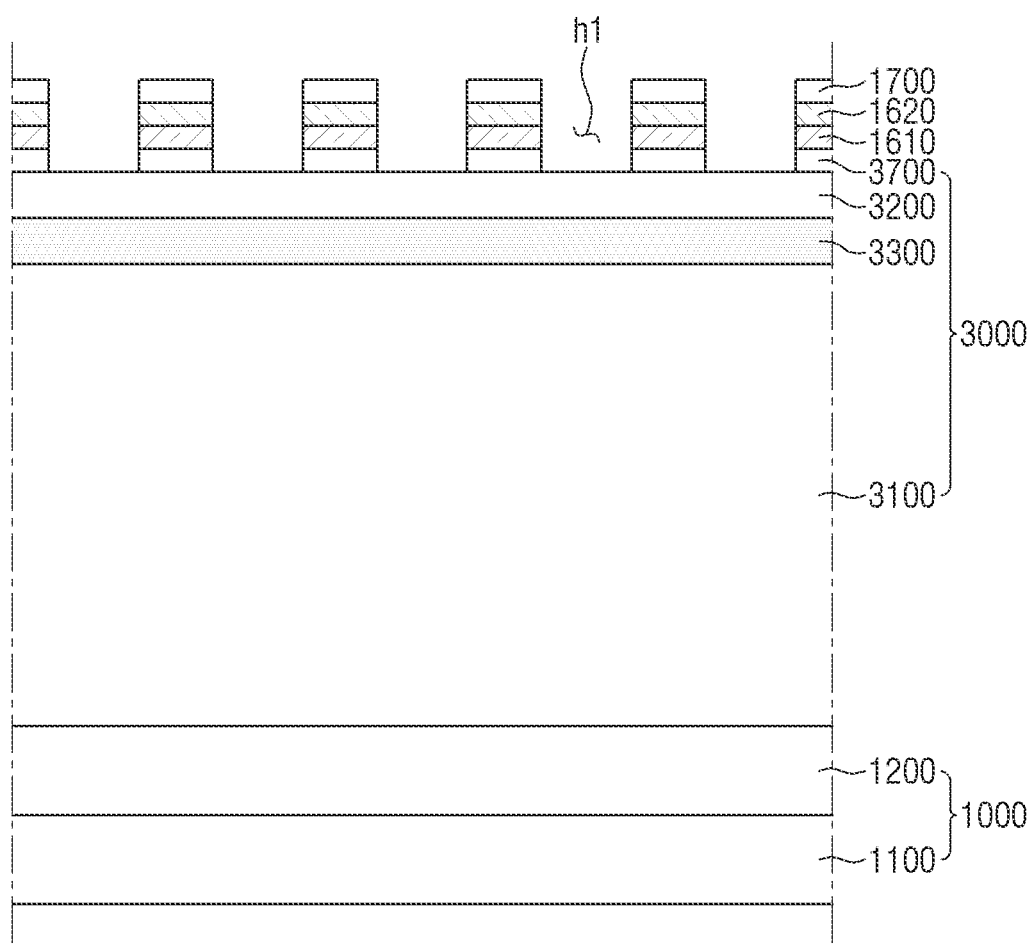
Figure 7:
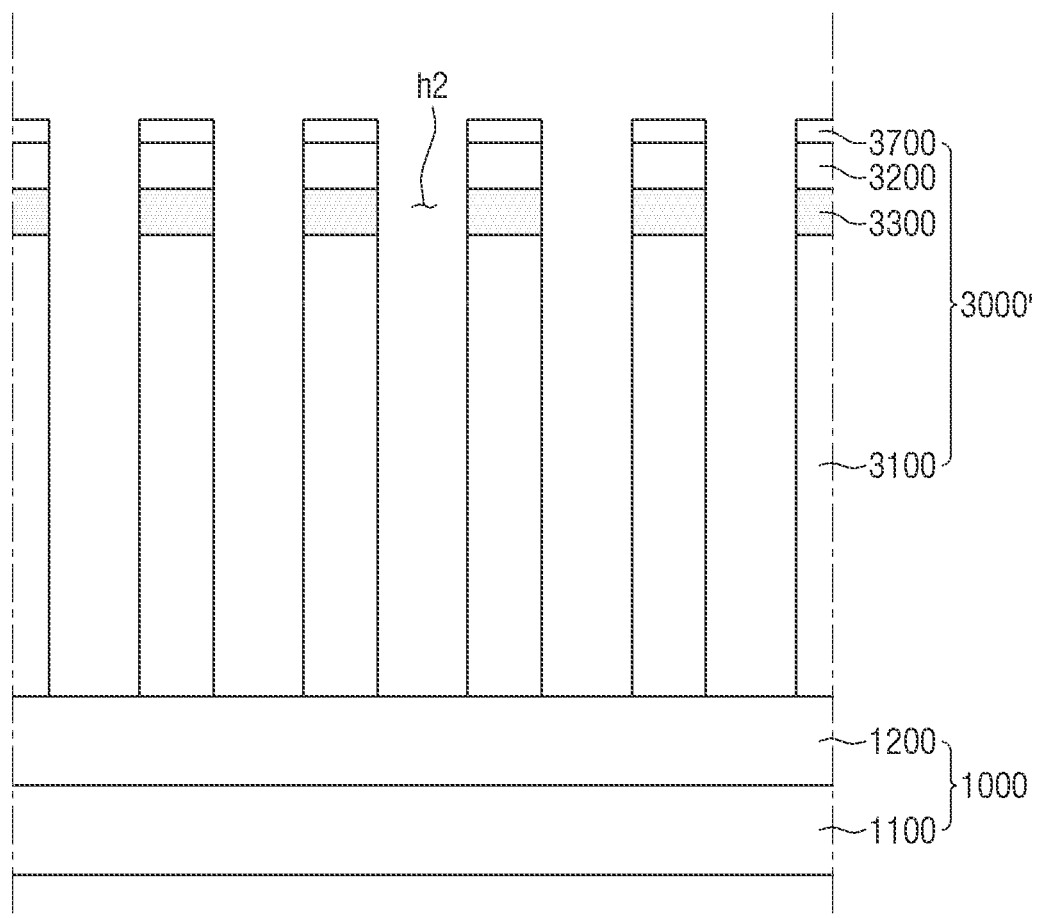

As shown in FIG. 6, the first hole h1 is formed by performing the first etching step to etch the etching mask layer 1610, 1620 and the conductive electrode material layer 3700. Further, the second etching step of forming the second hole h2 is performed by etching from the second conductive semiconductor layer 3200 to the first conductive semiconductor layer 3100 along the first hole h1. Finally, as shown in FIG. 7, the etching mask layer 1610, 1620 or the etching pattern layer 1700 remaining on the etched semiconductor structure 3000 may be removed to form the semiconductor crystal 3000'. The step of removing the etching mask layer 1610, 1620 or the etching pattern layer 1700 may be performed by a general etching process, and, for example, the etching process may include a reactive ion etching (RIE) method, an inductively coupled plasma-reactive ion etching (ICP-RIE) method, or the Ike.

In an embodiment, in the step of forming the semiconductor crystal 3000' by etching the semiconductor structure 3000, different patterning processes may be performed including the first etching step and the second etching step, and the semiconductor structure 3000 may be etched along the etching pattern layer 1700 by performing one patterning process.

Subsequently, the semiconductor rod ROD is formed by forming an insulating film 3800 partially surrounding an outer surface of the semiconductor crystal 3000'.

The insulating film 3800 is an insulating material formed on the outer surface of the semiconductor rod ROD, and may be formed by coating or immersing the insulating material on the outer surface of the vertically etched semiconductor crystal 3000'. However, the present invention is not limited thereto. For example, the insulating film 3800 may be formed by an atomic layer deposition (ALD) method or a chemical adsorption method. The insulating film 3800 may form the insulating film 380 of the light-emitting element 300.

Figure 8:
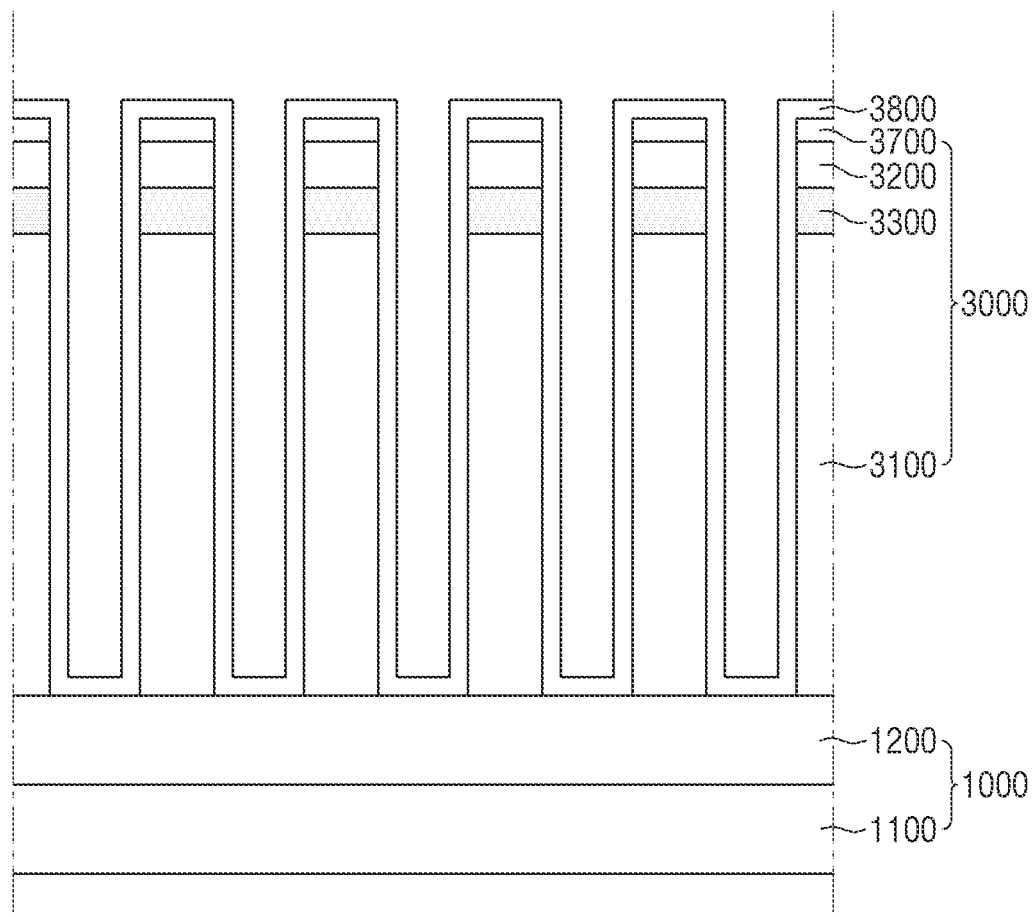
Figure 9:
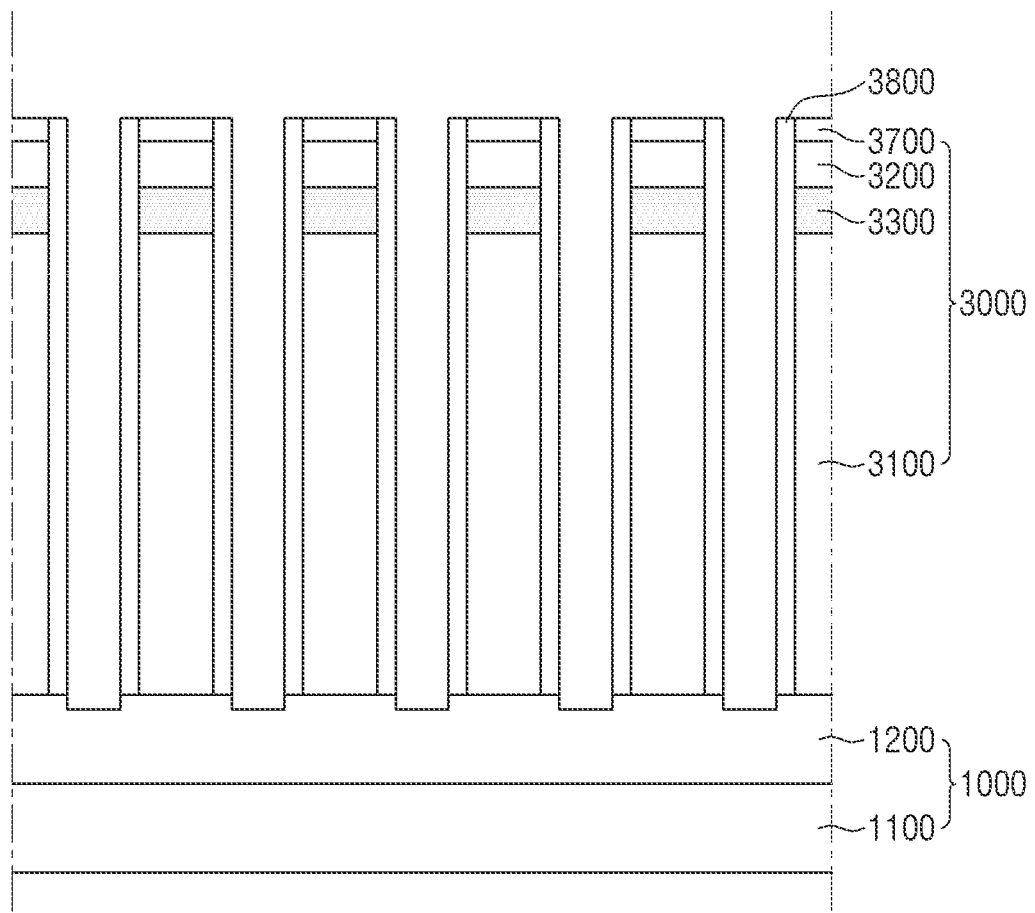

First, referring to FIG. 8, the insulating film 3800 may also be formed on the side and upper surfaces of the semiconductor crystal 3000', and the buffer material layer 1200 exposed to the outside as the semiconductor crystal 3000' is spaced apart and etched. When the insulating film 3800 is formed, the insulating film 3800 formed on the upper surface of the semiconductor crystal 3000' is removed to expose side surfaces of both end portions of the semiconductor crystal 3000'. As shown in FIG. 9, the insulating film 3800 disposed on at least the upper surface of the semiconductor crystal 3000' and the buffer material layer 1200 may be removed to expose the upper surface of the semiconductor crystal 3000'. To this end, a process such as etchback or dry etching, which is anisotropic etching, may be performed. Accordingly, the insulating film 3800 surrounding an outer circumferential surface of the semiconductor crystal 3000' may be partially removed, and the semiconductor rod ROD including the semiconductor crystal 3000' and the insulating film 3800 may be formed. The semiconductor rod ROD may be separated from the base substrate 1000 in a step which will be described later to form the light-emitting element 300.

According to an embodiment, in the step of partially removing the insulating film 3800, the buffer material layer 1200 may be formed with uneven patterns 1200P (see FIG. 10) including one or more groove portions 1200a in which partial regions are recessed and protrusions 1200b formed as the groove portions 1200a are spaced apart.

Since the insulating film 3800 and the buffer material layer 1200 have different etch selectivities, the buffer material layer 1200 may also be partially removed when the insulating film 3800 is removed. In the process of partially removing the insulating film 3800, a portion of the buffer material layer 1200 may be recessed to form the groove portion 1200a.

As shown in the drawings, the buffer material layer 1200 may be partially etched along the second hole h2 where the semiconductor rods RODs are spaced apart from each other. The etched region may be recessed to form the groove portion 1200a. That is, the groove portion 1200a may be formed as the second hole h2 extends to a partial region of the buffer material layer 1200. In the buffer material layer 1200, a plurality of groove portions 1200a may be formed, and regions where the groove portions 1200a are spaced apart from each other may relatively protrude to form the protrusions 1200b. The protrusions 1200b may be regions which are not substantially etched due to the semiconductor rods ROD. In other words, the semiconductor rods ROD may be formed on the protrusions 1200b.

As described above, each of the uneven patterns 1200P of the buffer material layer 1200 may be formed along the second hole h2 formed in the step of etching the semiconductor structure 3000 in the direction perpendicular to the base substrate 1000. Since the second hole h2 may be formed according to the structure of the etching pattern layer 1700, a structure of each of the uneven patterns 1200P of the buffer material layer 1200 may vary according to the etching pattern layer 1700. The drawings illustrate that the plurality of groove portions 1200a have the same diameter and are spaced apart from each other at the same interval in the uneven patterns 1200P of the buffer material layer 1200, but the present invention is not limited thereto. In some cases, in order to manufacture the light-emitting elements 300 having different diameters, the nanopatterns of the etching pattern layer 1700 may have different diameters or may have different spaced intervals.

Accordingly, in the uneven patterns 1200P of the buffer material layer 1200, the groove portions 1200a may have different diameters or may be spaced apart from each other at different intervals. That is, the plurality of groove portions 1200a and the protrusions 1200b of the uneven patterns 1200P may each have a different diameter.

In some cases, the buffer material layer 1200 may not include the uneven pattern 1200P and may have a shape of which an upper surface is substantially flat.

Next, the semiconductor rods ROD are separated from the base substrate 1000 to manufacture the light-emitting elements 300. Here, when the semiconductor rods ROD are directly separated from the base substrate 1000, a lower end portion of the semiconductor rod ROD, that is, the semiconductor crystal of the first conductive semiconductor layer 3100, may be cracked or a surface to be separated may be uneven. In this case, a contact failure between the electrodes and the light-emitting elements 300 may occur in the display device using the manufactured light-emitting elements 300.

The method of manufacturing the light-emitting element 300 according to an embodiment may include separating steps (S200 and S400) of forming an element structure 5100, 5200 surrounding the semiconductor rods ROD, and performing separation using the element structure 5100, 5200. When the semiconductor rods ROD are separated from the base substrate 1000, the first element structure 5100 including the first support 5110 having a relatively high hardness to prevent or substantially prevent defects from being formed in the semiconductor layer of the semiconductor rod ROD is formed to perform the first separating step (S200). Further, after partially etching the first element structure 5100, the second element structure 5200 including a second support 5210 having a relatively low hardness is formed to remove the supports, and then the second separating step (S400) of separating the semiconductors rod ROD is performed.

Figure 10:
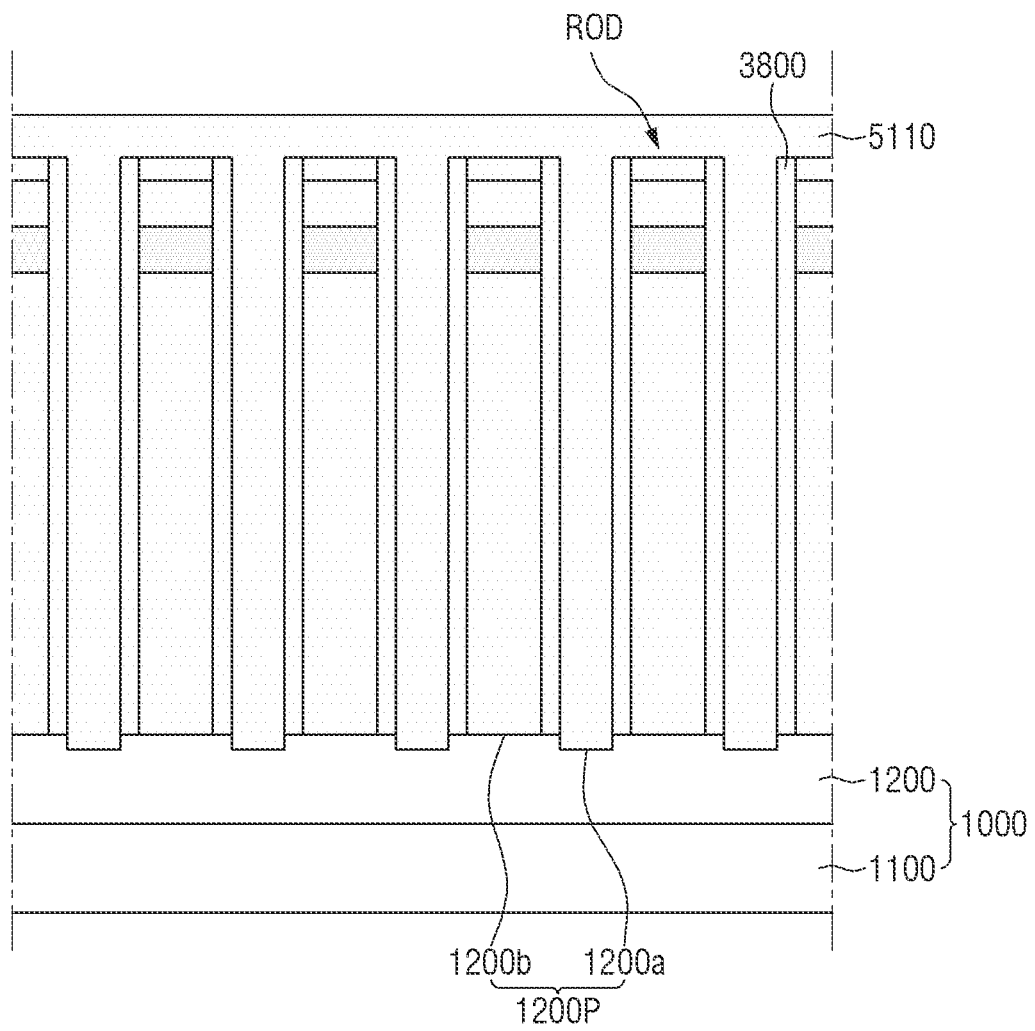
Figure 11:
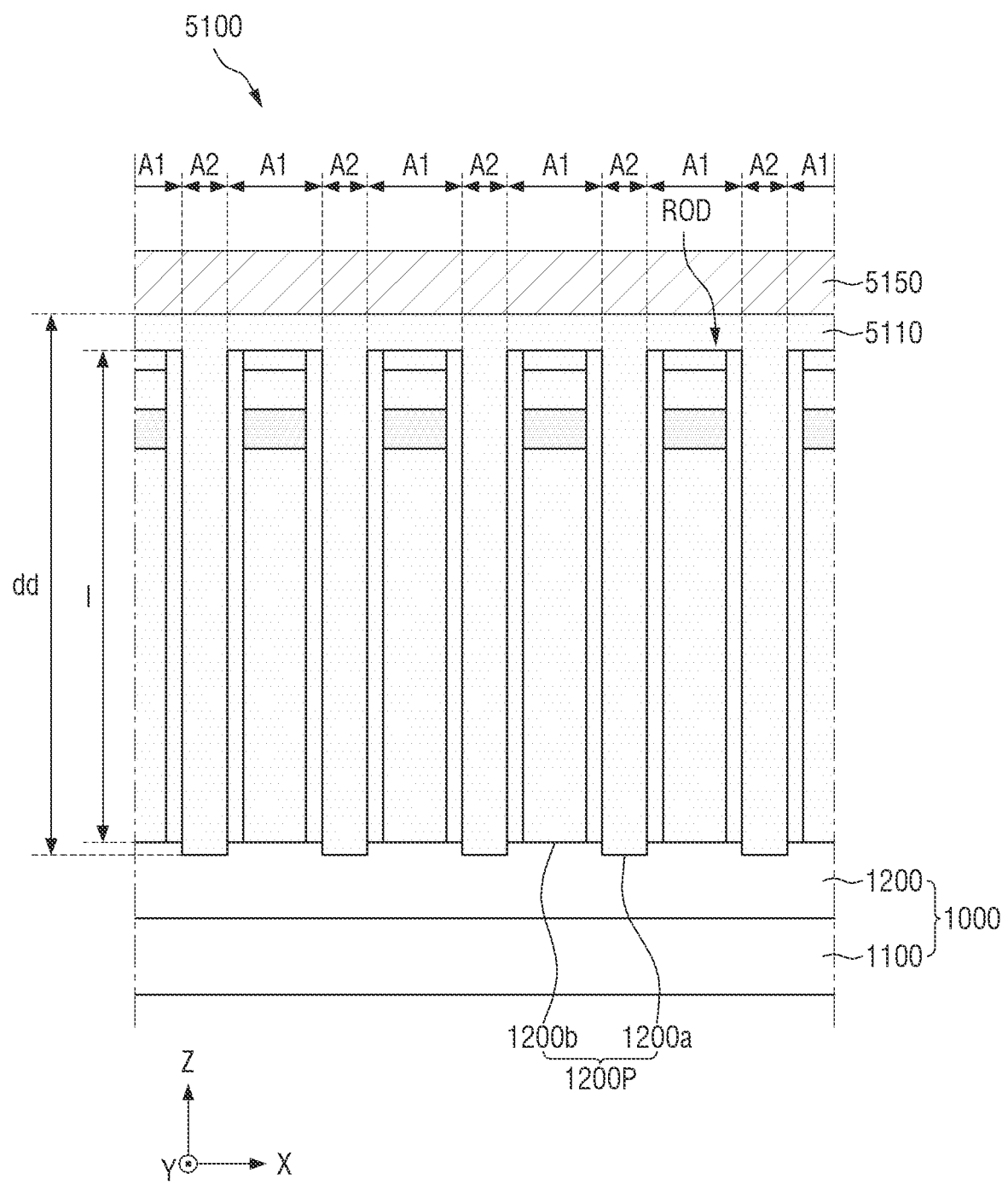
Figure 12:
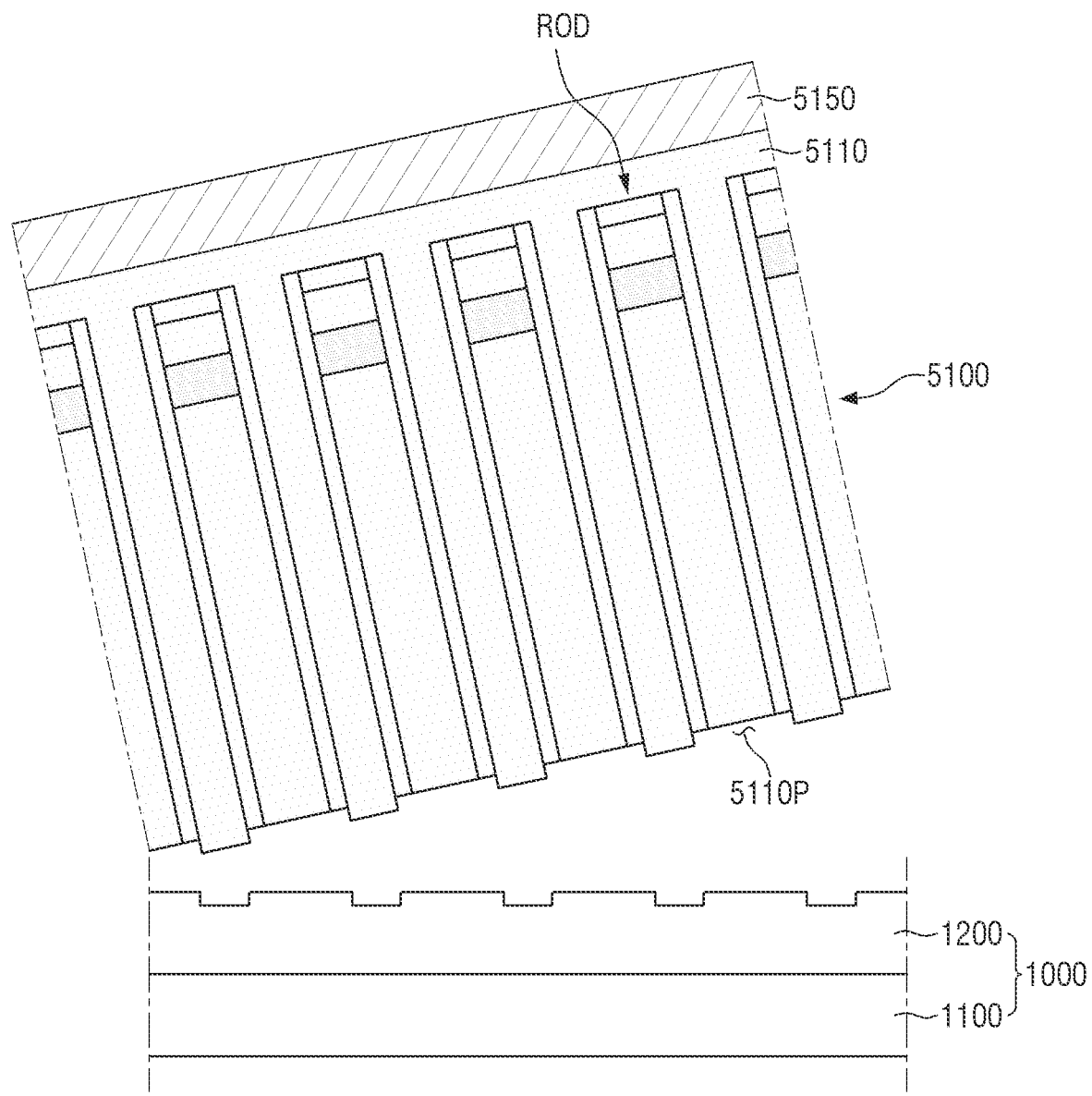

In a further detailed description of the first and second separating steps (S200 and S400) with reference to FIGS. 10 to 20, first, as shown in FIGS. 10 to 12, the first element structure 5100 including the semiconductor rods ROD and the first support 5110 is formed. The step of forming the first element structure 5100 according to an embodiment includes a step of forming the first support 5110 surrounding the semiconductor rods ROD, a step of forming the first element structure 5100 including the first support 5110 and an auxiliary layer 5150 disposed on the first support 5110, and a step of separating the first element structure 5100 from the base substrate 1000.

First, as shown in FIG. 10, the first support 5110 surrounding the semiconductor rods ROD on the base substrate 1000 is formed.

The first support 5110 may be disposed to surround outer surfaces of the semiconductor rods ROD disposed on the base substrate 1000 and cover upper surfaces of the semiconductor rods ROD. In an embodiment, the first support 5110 is substantially formed on the entire base substrate 1000, and the semiconductor rods ROD may be included in the first support 5110. A thickness dd of the first support 5110 may be greater than the length l of a long axis of the semiconductor rod ROD to cover the upper surface of the semiconductor rod ROD, for example, the upper surface of the conductive electrode material layer 3700. For example, when the length l of the long axis of the semiconductor rod ROD is 4 to 7 µm, the thickness dd of the first support 5110 may be 6 µm to 10 µm. However, the present invention is not limited thereto.

An upper surface of the first support 5110 may be formed to be substantially flat and may form a surface parallel to the base substrate 1000. The auxiliary layer 5150 may be formed on the upper surface of the first support 5110.

A lower surface of the first support 5110 may be formed to come into contact with the buffer material layer 1200. As described above, the uneven pattern 1200P including the groove portion 1200a and the protrusion 1200b may be formed on the buffer material layer 1200, and an upper surface of the buffer material layer 1200 may not be flat. The lower surface of the first support 5110 may be formed along the uneven pattern 1200P of the buffer material layer 1200, and, in an embodiment, the lower surface of the first support 5110 may be formed to come into contact with an upper surface of the groove portion 1200a of the buffer material layer 1200, and surround side surfaces of the protrusion 1200b.

The first support 5110 is formed to surround the upper and side surfaces of the semiconductor rod ROD to protect the semiconductor rod ROD formed on the protrusion 1200b. Here, in a case in which a gap is formed between the side and lower surfaces of the semiconductor rod ROD, the lower surface of the semiconductor rod ROD may be partially damaged when the first support 5110 is separated from the base substrate 1000. To prevent or substantially prevent this, the first support 5110 may be disposed to surround the side surface of the semiconductor rod ROD, and to surround the side surface of the protrusion 1200b of the buffer material layer 1200 which comes into contact with the lower surface of the semiconductor rod ROD. Accordingly, the lower surface of the first support 5110 formed along the uneven pattern 1200P of the buffer material layer 1200 may be formed with a recessed pattern 5110P of which at least a partial region is recessed.

In an embodiment, the first support 5110 may include a thermosetting resin. For example, the first support 5110 may include polydimethylsiloxane (PDMS), an epoxy resin, a polyester resin, or the like. However, the present invention is not limited thereto. The step of forming the first support 5110 may include a step of spraying a solvent including a thermosetting resin onto the base substrate 1000 and a step of curing the thermosetting resin. In an embodiment, the step of spraying the solvent may be performed through an inkjet printing method, a spin coating method, a die-slot coating method, a slit coating method, or the like. However, the present invention is not limited thereto.

The first support 5110 may include the thermosetting resin and thus may have a relatively high hardness. When the first support 5110 is separated from the base substrate 1000, the semiconductor rods ROD may also be included in the first support 5110 and concurrently (e.g., simultaneously) separated. In this case, the first support 5110 may fix the semiconductor rods ROD to prevent or substantially prevent damage from occurring when the semiconductor rods ROD are separated.

Subsequently, as shown in FIG. 11, the auxiliary layer 5150 is formed on the first support 5110 to form the first element structure 5100.

The auxiliary layer 5150 is disposed on the first support 5110. In an embodiment, the auxiliary layer 5150 may be a thermal release tape (TRT), polyethylene terephthalate (PET), a plastic film, or the like. However, the present invention is not limited thereto.

Subsequently, as shown in FIG. 12, the first element structure 5100 is separated from the base substrate 1000. The first element structure 5100 includes the first support 5110, the semiconductor rods ROD included in the first support 5110, and the auxiliary layer 5150, and the semiconductor rods ROD may be separated from the base substrate 1000 in the first element structure 5100. As described above, the first support 5110 of the first element structure 5100 may include a material having a relatively high hardness to prevent or substantially prevent damage to the semiconductor rods ROD, and a separation surface between the semiconductor rods ROD and the base substrate 1000 may have a smooth shape.

In an embodiment, the first element structure 5100 may include the recessed pattern 5110P formed on a surface separated from the base substrate 1000 and of which at least a partial region is recessed. As described above, the first support 5110 may be formed on the uneven pattern 1200P formed on the buffer material layer 1200 of the base substrate 1000, and one surface of the first support 5110 which comes into contact with the buffer material layer 1200 may be formed with an uneven pattern. As shown in the drawing, the first element structure 5100 separated from the base substrate 1000 includes the recessed pattern 5110P formed on the surface, and an end portion of the semiconductor rod ROD may be exposed in the recessed pattern 5110P.

In an embodiment, the semiconductor rod ROD may extend in the first support 5110 in a first direction, and in the first support 5110, a first region A1 overlapping the semiconductor rod ROD and a second region A2 other than the first region A1 not overlapping the semiconductor rod ROD may be defined. Since the semiconductor rods ROD grown on the base substrate 1000 are disposed to be spaced apart from each other, the first support 5110 formed entirely on the base substrate 1000 may include a region overlapping the semiconductor rod ROD (the first region A1) and a region not overlapping the semiconductor rod ROD (the second region A2).

The second region A2 of the first support 5110 may be a region in which the first hole h1 or the second hole h2 is formed by etching the above-described semiconductor structure 3000 perpendicularly to the base substrate 1000. That is, the second region A2 of the first support 5110 may be a region overlapping the groove portion 1200a from which the buffer material layer 1200 is partially removed by vertically etching the semiconductor structure 3000, and the first region A1 may be a region overlapping the protrusion 1200b of the buffer material layer 1200 on which the semiconductor rod ROD is grown.

Subsequently, the first element structure 5100 is partially etched to remove a portion of the first support 5110, and the second support 5210 is formed in the region from which the first support 5110 is removed to form the second element structure 5200.

Figure 13:
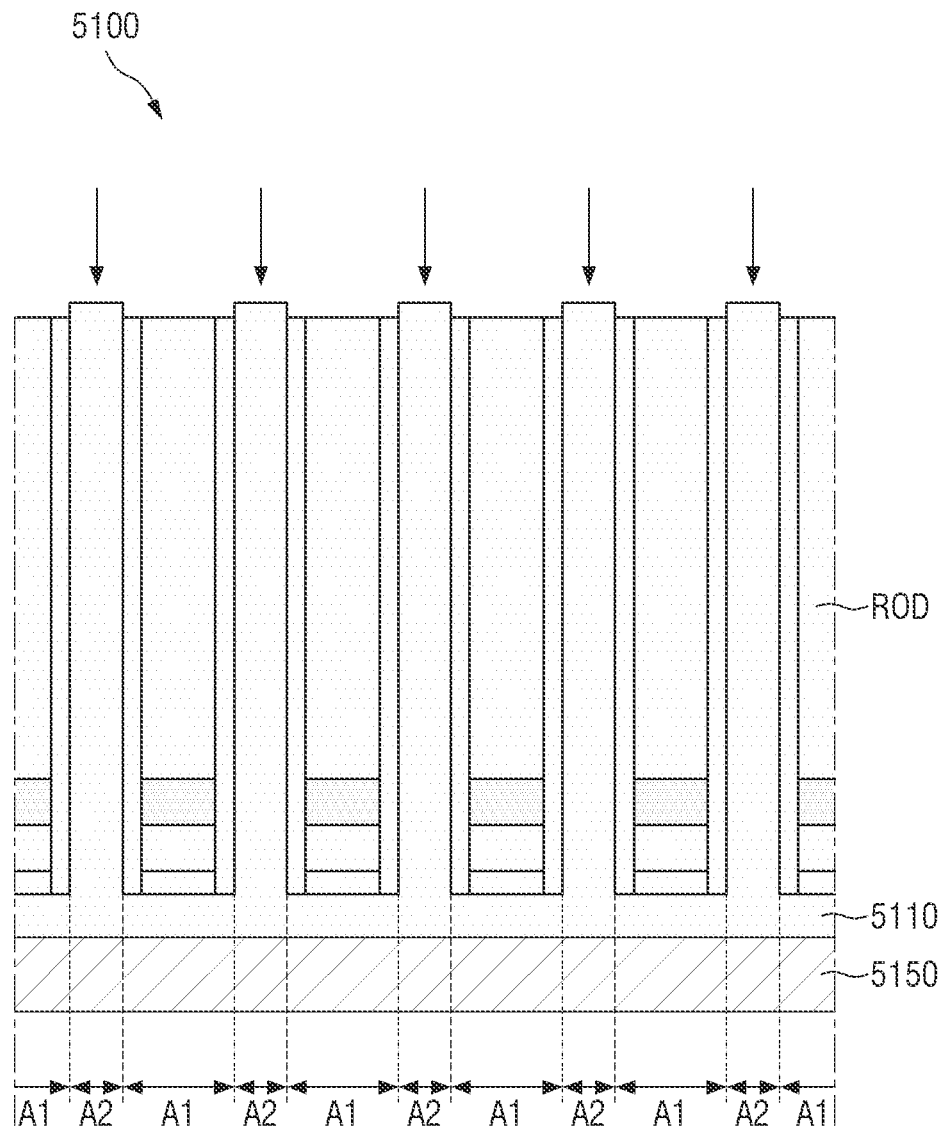
Figure 14:
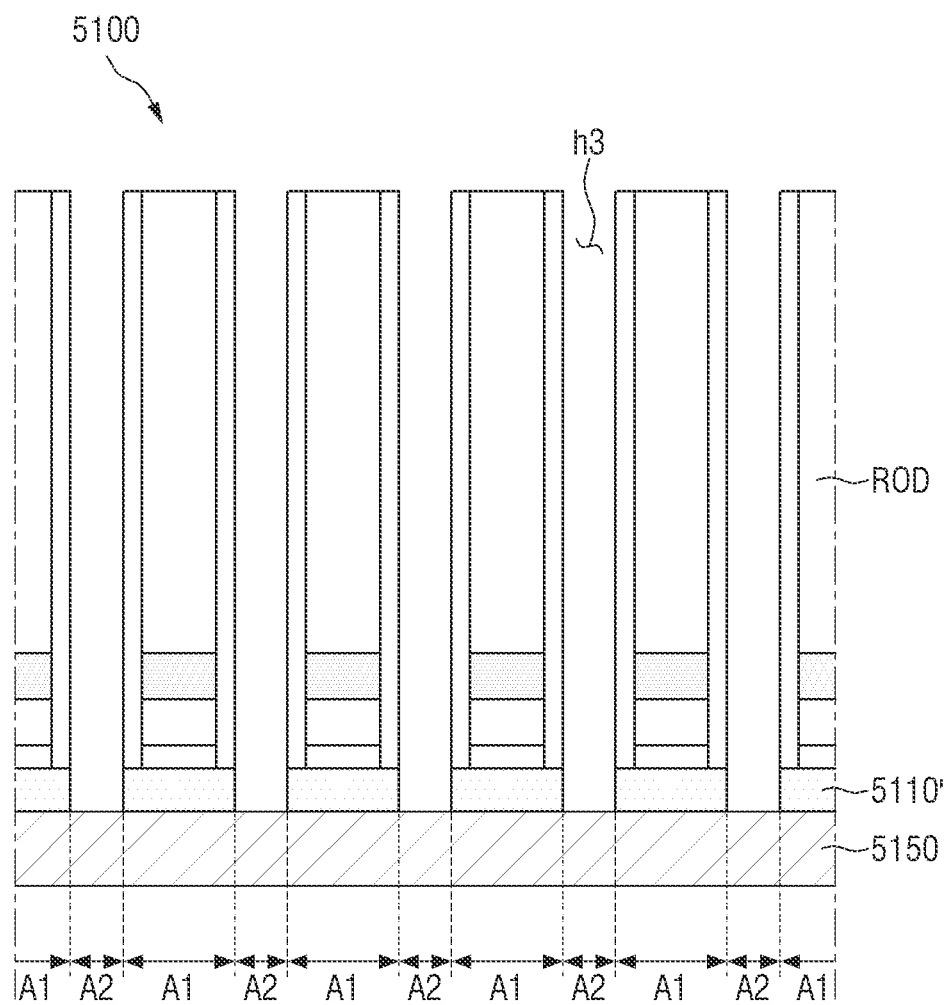

First, as shown in FIGS. 13 and 14, at least a portion of the first support 5110 is removed by etching the first element structure 5100 in a direction, for example, in a direction in which the semiconductor rod ROD extends or in a direction perpendicular to the auxiliary layer 5150. In an embodiment, in the first element structure 5100, a third hole h3 may be formed in a region where the second region A2 of the first support 5110 may be etched in a direction in which the semiconductor rod ROD extends, and the first support 5110 is etched and removed.

The second region A2 is the region not overlapping the semiconductor rod ROD, and may be etched in the direction to remove at least a portion of the first support 5110. Accordingly, in the semiconductor rod ROD, one end portion and side surfaces of the first conductive semiconductor layer 3100 may be exposed along the third hole h3. As shown in FIG. 14, in the first element structure 5100, since the second region A2 of the first support 5110 is etched and removed, only a first support 5110' disposed on the conductive electrode material layer 3700 that is one end portion of the semiconductor rod ROD may remain. A depth of the third hole h3 is not particularly limited, but the drawings illustrate that the depth of the third hole h3 is greater than the semiconductor rod ROD and is the same as the thickness dd of the first support 5110. However, the present invention is not limited thereto. The first support 5110' remaining in a region other than the third hole h3 is a first support 5110' disposed in the first region A1 and may be removed in a step which will be described later.

The drawings illustrate that the first support 5110 in the second region A2 is removed in the direction and, thus, only the first support 5110' in the first region A1 remains. However, the present invention is not limited thereto, the first support 5110 in the second region A2 may be partially removed, and other members may be further disposed on the exposed end portion of the semiconductor rod ROD. That is, the depth of the third hole h3 may be less than a length of the semiconductor rod ROD. The first support 5110 in the second region A2 may be concurrently (e.g., simultaneously) removed with the members. For a further detailed description of the above, reference is made to other embodiments.

Figure 15:
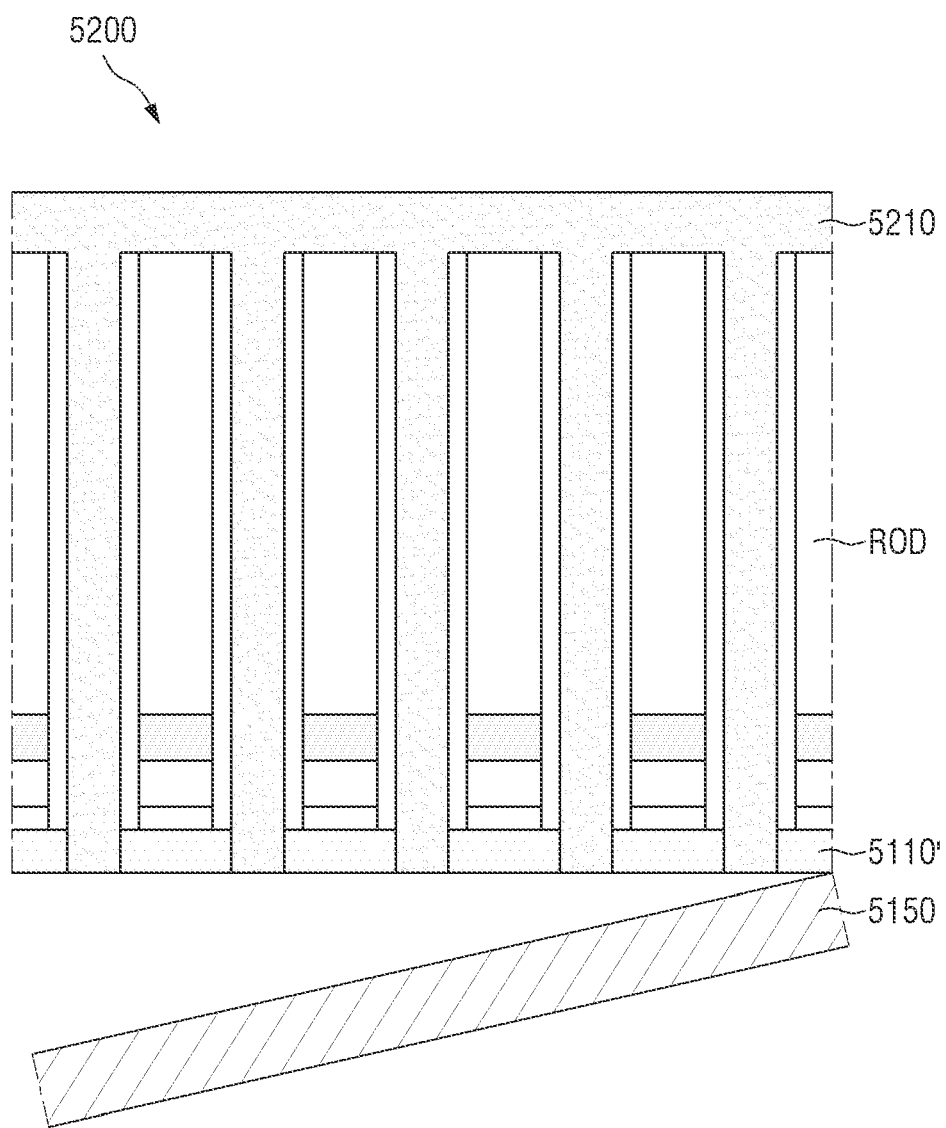

Subsequently, as shown in FIG. 15, the second support 5210 is formed in the region from which the first support 5110 is removed, and the auxiliary layer 5150 is removed to form the second element structure 5200. The second support 5210 may be formed in the region from which the first support 5110 is etched and removed, that is, the second region A2. In an embodiment, the second support 5210 may be formed to surround the side surfaces and one end portion of the semiconductor rod ROD exposed to the second region A2, and the first support 5110' remaining in the first region A1. The second support 5210 may be formed to fill the third hole h3.

According to an embodiment, the second support 5210 may include a thermosetting resin having a lower hardness than the first support 5110. For example, the second support 5210 may include polymethylmethacrylate (PMMA). The second support 5210 may include a thermosetting resin having a lower hardness than the first support 5110. However, the present invention is not limited thereto, and, in an embodiment, the second support 5210 may include a same type of resin as the first support 5110, but may have a lower hardness than the first support 5110 by adjusting a degree of curing. In an embodiment, like the first support 5110, the second support 5210 may be formed by spraying a solvent including a thermosetting resin and then curing the solvent.

After the second support 5210 is formed, the auxiliary layer 5150 disposed on a surface of the second support 5210 is removed to form the second element structure 5200. For example, the auxiliary layer 5150 may be separated from the second support 5210 by including a thermal separation tape and performing a process of heating to a certain temperature (e.g., a predetermined temperature). However, the present invention is not limited thereto.

The second element structure 5200 may include the semiconductor rod ROD, the first support 5110' remaining in the first region A1, and the second support 5210. When the semiconductor rod ROD is directly separated from the first element structure 5100, the semiconductor rod ROD may be damaged in the process of removing the first support 5110 having a relatively high hardness. To prevent or substantially prevent this, the second element structure 5200 including the second support 5210 having a relatively low hardness may be formed to minimize or reduce damage to the semiconductor rod ROD, and separate the semiconductor rod ROD (S400). The semiconductor rod ROD may be separated from the second element structure 5200 by performing a step of removing the first support 5110' remaining in the first region A1 and a step of removing the second support 5210.

The second separating step (S400) will be described with reference to FIGS. 16 to 19. The second separating step (S400) according to an embodiment may include a step of etching the second element structure 5200 in a direction, for example, in a direction perpendicular to the direction in which the semiconductor rod ROD extends to remove the first support 5110' remaining in the second element structure 5200.

Figure 16:
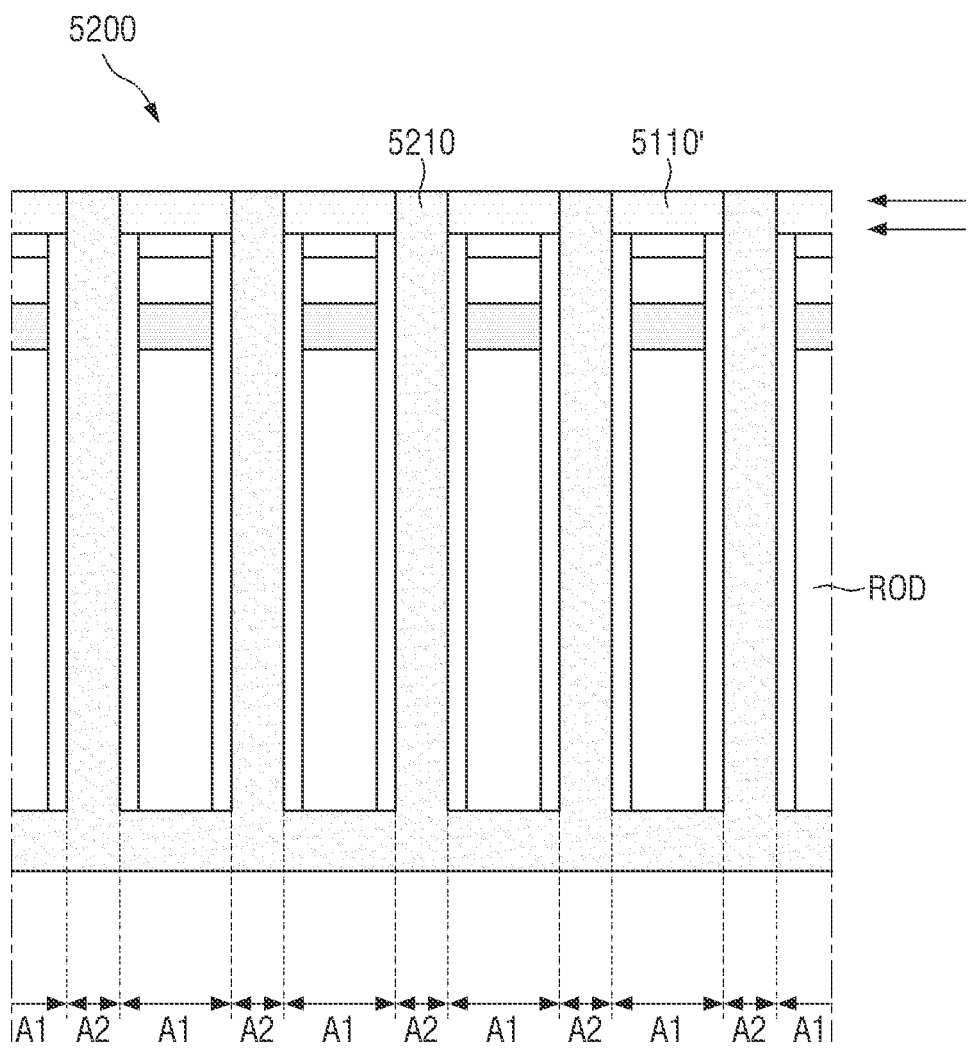

As shown in FIG. 16, the first support 5110' formed in the first region A1 may remain at one side of the second element structure 5200. In order to remove this, the first support 5110' may be removed in the direction perpendicular to the direction in which the semiconductor rod ROD extends, and, accordingly, the one end portion of the semiconductor rod ROD may be exposed. In an embodiment, the step of etching the second element structure 5200 in a direction to remove the first support 5110' may be performed in the same manner as a step of etching the first element structure 5100 in a direction to remove the first support 5110 in the second region A2. In order to remove the first support 5110 having a relatively high hardness compared to the second support 5210, a process of etching or aching the first support 5110 may be performed.

Figure 17:
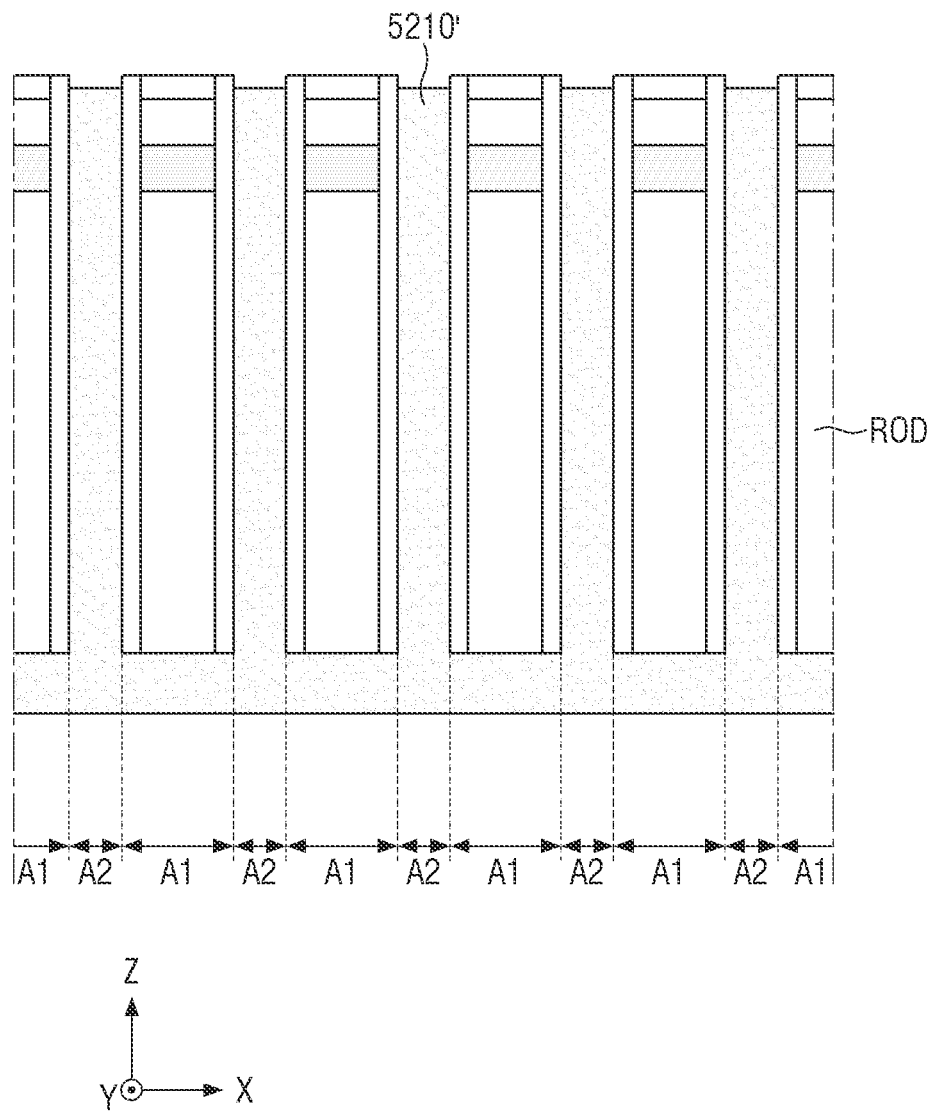

When the second element structure 5200 is etched in the direction, the conductive electrode material layer 3700, which is an end portion of the semiconductor rod ROD, may be exposed. As shown in FIG. 17, in the second element structure 5200, the first support 5110' and a portion of the second support 5210 are removed, and a remaining second support 5210' and the semiconductor rod ROD remain.

Figure 18:
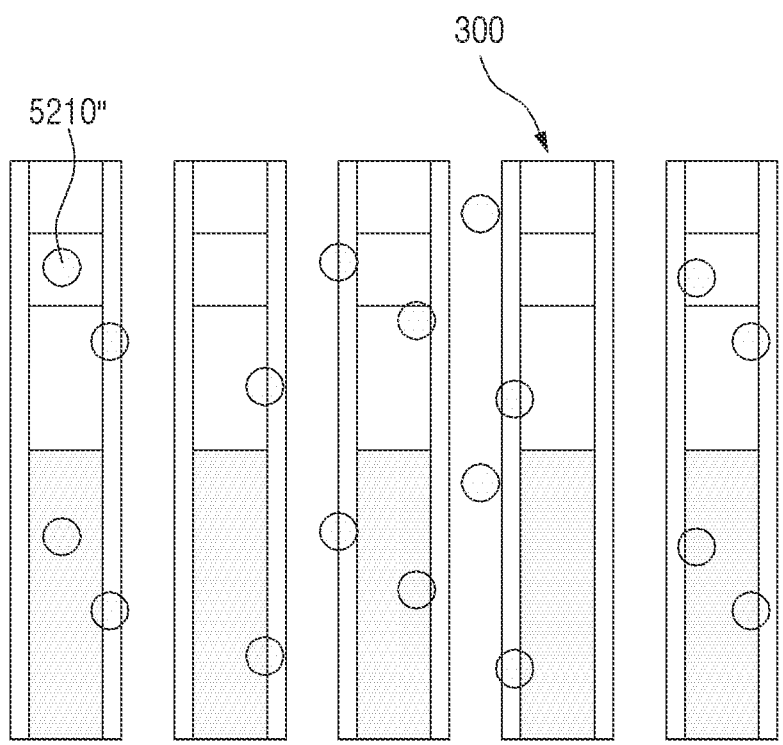
Figure 19:
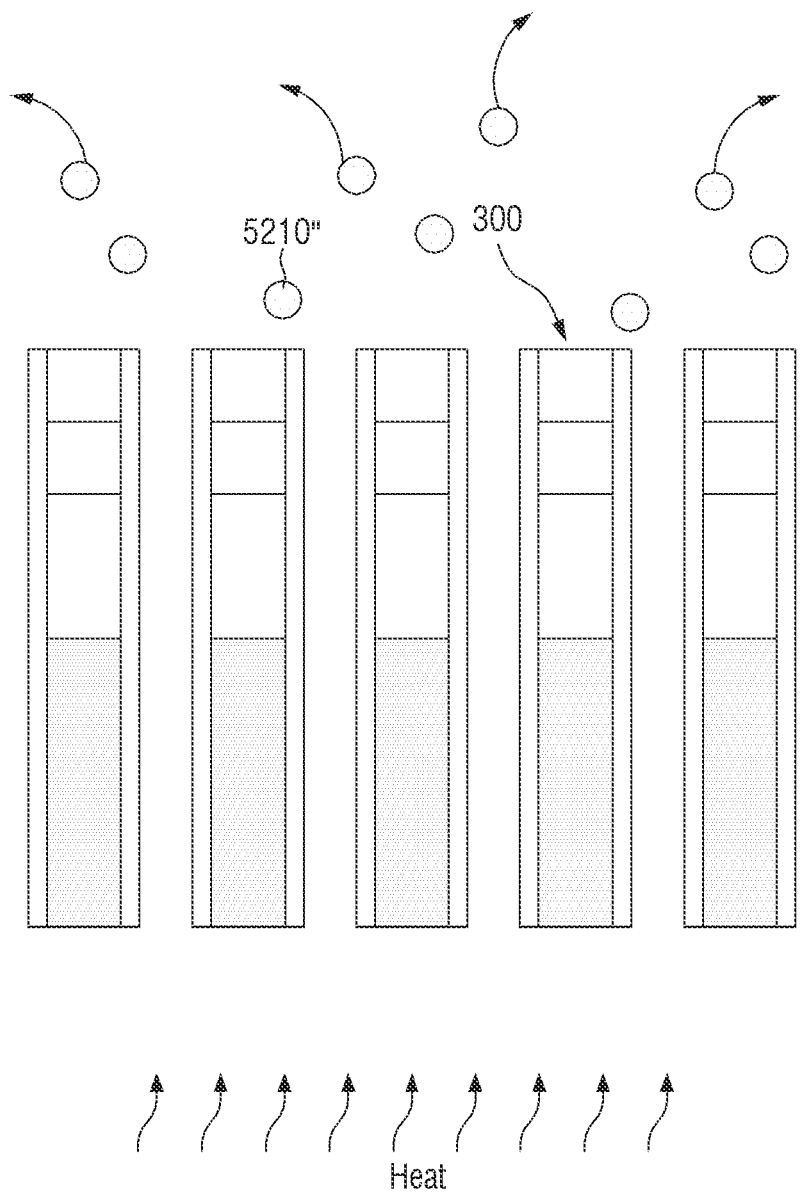

Finally, as shown in FIGS. 18 and 19, the semiconductor rod ROD is separated by removing the second support 5210' of the second element structure 5200. The semiconductor rod ROD separated by removing the second support 5210' may constitute the light-emitting element 300.

In an embodiment, in the step of removing the second support 5210', the second support 5210' may be removed through etching or aching or by dissolving a resin of the second support 5210' in a solvent (e.g., a predetermined solvent). The drawings illustrate that the second support 5210' is dissolved in the solvent to be removed, but the present invention is not limited thereto.

In an embodiment, the second support 5210 may be dissolved in water, acetone, and isopropyl alcohol. As shown in the drawing, resin 5210" of the second support 5210 dissolved in the solvent remains on the semiconductor rod ROD, and the semiconductor rods ROD may be separated.

As shown in FIG. 19, in an embodiment, the resin 5210" of the second support 5210 dissolved in the solvent is removed by volatilization. The second support 5210 may be dissolved in the solvent to be removed by volatilization at a temperature level at which the semiconductor rod ROD is not damaged. Through the above method, the light-emitting element 300 may be manufactured by separating the semiconductor rod ROD from the second element structure 5200.

Accordingly, the manufactured light-emitting element 300 has a smooth shape without damage to the first and second conductive semiconductors 310 and 320, the insulating film 380, or the conductive electrode layer 370, even when separated from the base substrate 1000 by a physical method. At the same time, a plurality of light-emitting elements 300 may be manufactured with a uniform or substantially uniform size or length, and the light-emitting elements 300 minimize or reduce contact defects with the electrodes and light emission defects on the display device 1, which will be described later, to enhance light emission reliability of the display device 1.

According to an embodiment, the light-emitting element 300 may have a surface of which both end portion surfaces are substantially flat and may satisfy the following Equation 1:

$$0 \leq (\sigma_L/L_{mean}) \times 100(\%) \leq 20, \qquad \text{Equation 1}$$

where, $\sigma_L$ is the standard deviation of lengths of the light-emitting elements 300, and $L_{mean}$ is an average of the lengths of the light-emitting elements 300.

The plurality of semiconductor rods ROD grown on the base substrate 1000 may be separated from the base substrate 1000 through the first and second element structures 5100 and 5200 to form the plurality of light-emitting elements 300. When the plurality of light-emitting elements 300 are separated from the base substrate 1000 by a physical method, since semiconductor crystal damage may be prevented or substantially prevented, deviations in length and size may be minimized or reduced. In an embodiment, the length l of the light-emitting element 300 may have a value in which a ratio of the standard deviation ($\sigma_L$) and the average value ($L_{mean}$) is 0 to 0.2. However, the present invention is not limited thereto.

In an embodiment, the light-emitting elements 300 manufactured through the above-described method may be manufactured in a state of being dispersed in an ink (e.g., a predetermined ink).

Figure 20:
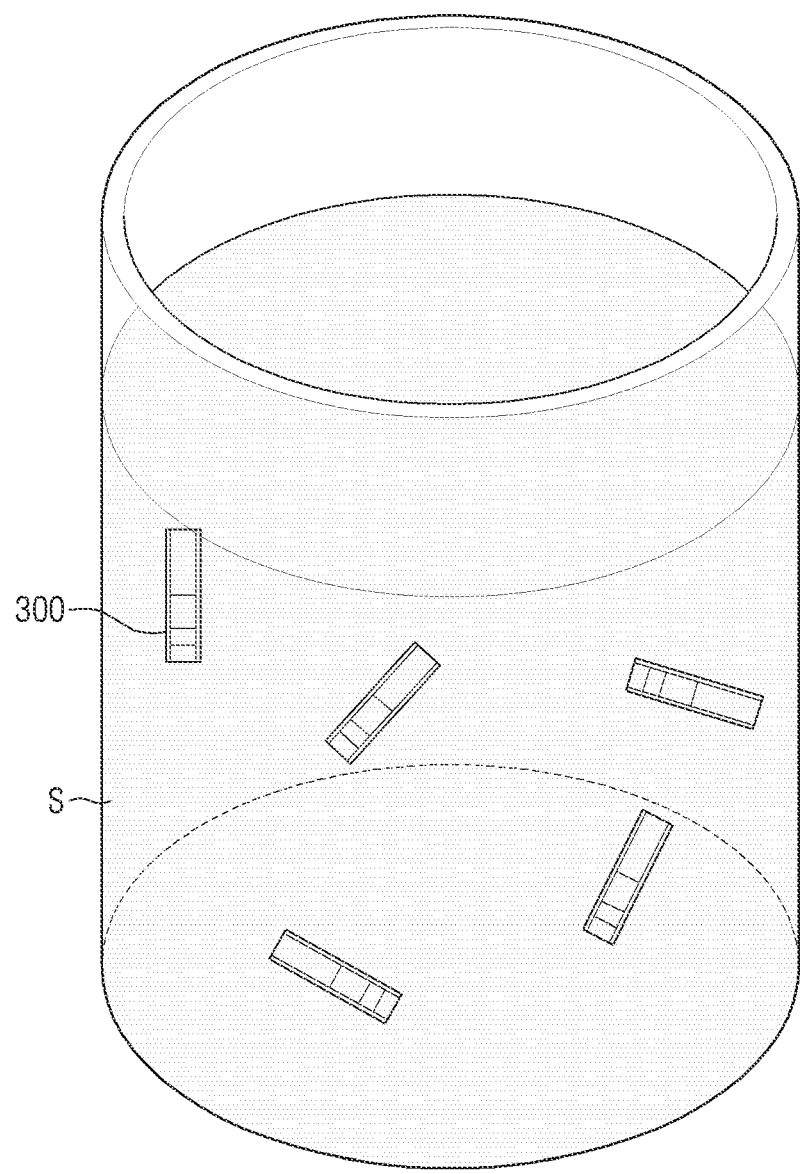

As shown in FIG. 20, the light-emitting elements 300 may be dispersed in an element ink S to be manufactured. The element ink S does not react with the light-emitting elements 300 and may include a solvent which may be volatilized during a manufacturing process of the display device 1. For example, the solvent may include propylene glycol monomethyl ether (PGME), propylene glycol monomethyl ether acetate (PGMEA), propylene glycol (PG), or the like. However, the present invention is not limited thereto.

Further, although not shown in the drawings, the element ink S may further include an element dispersant to disperse the light-emitting elements 300 including the semiconductor materials and thus having a large specific gravity. The light-emitting elements 300 may be sprayed onto the electrodes in a state of being dispersed in the element ink S when the display device 1 is manufactured.

The light-emitting element 300 in FIG. 1 may be manufactured through the above-described method. The light-emitting element 300 in FIG. 1 may emit light in a certain wavelength band, for example, blue light, and the display device 1 according to an embodiment may include at least one light-emitting element 300 to display light of a certain color.

Figure 21:
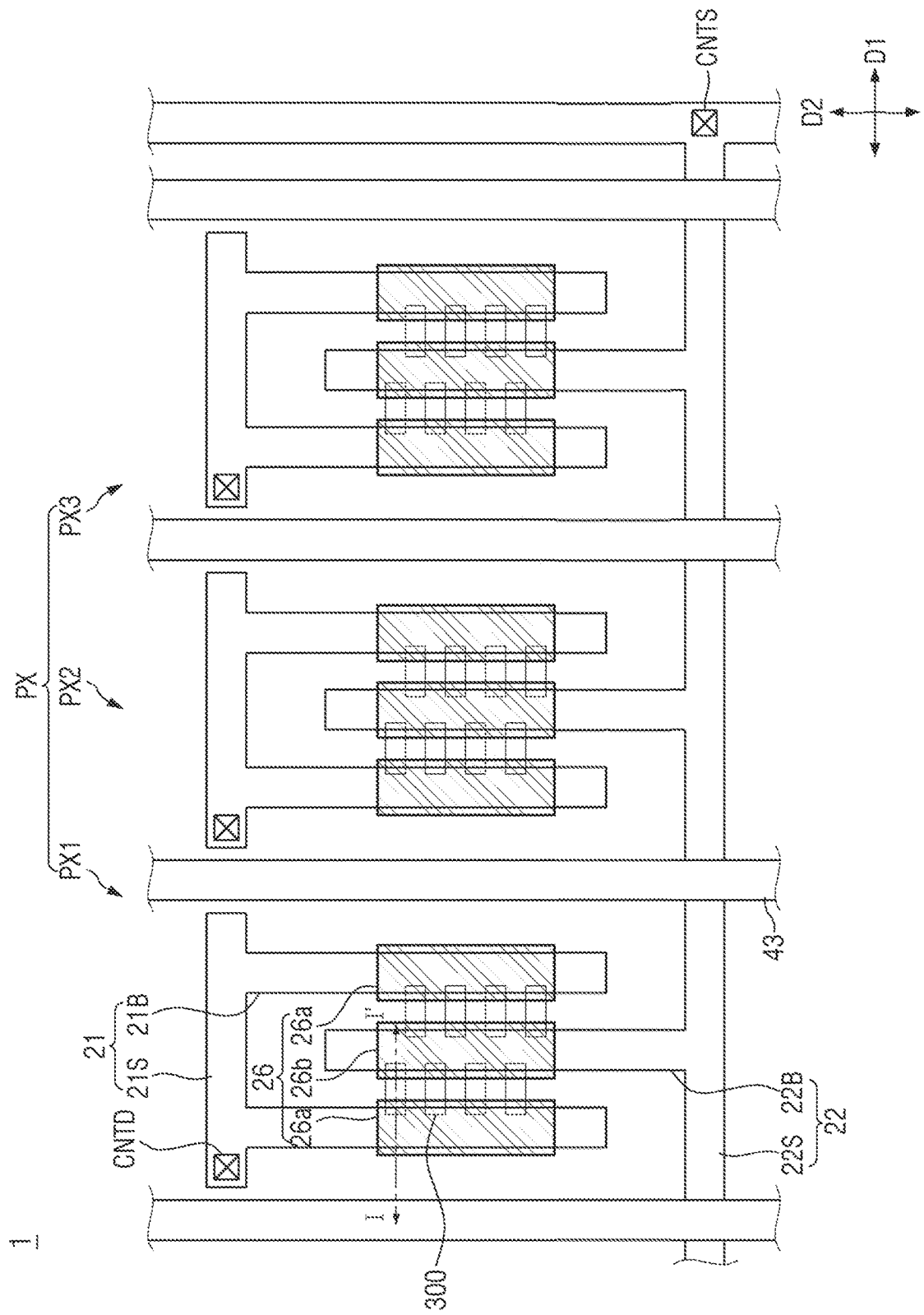
FIG. 21 is a plan view of a display device according to an embodiment.

FIG. 21 is a plan view of a display device including the light-emitting element manufactured through a method according to an embodiment.

Referring to FIG. 21, the display device 1 may include a plurality of pixels PX. Each of the pixels PX may include one or more light-emitting elements 300 which emit light in a certain, or specific, wavelength band to display a certain, or specific, color.

Each of the plurality of pixels PX may include a first sub pixel PX1, a second sub pixel PX2, and a third sub pixel PX3. The first sub pixel PX1 may emit light of a first color, the second sub pixel PX2 may emit light of a second color, and the third sub pixel PX3 may emit light of a third color. The first color may be red, the second color may be green, and the third color may be blue, but the present invention is not limited thereto, and the sub pixels PX1, PX2, PX3 may emit light of a same color. Further, although FIG. 21 illustrates that each of the pixels PX includes three sub pixels, the present invention is not limited thereto, and each of the pixels PX may include a larger number of sub pixels.

Each of the sub pixels PX1, PX2, PX3 of the display device 1 may include regions defined as a light emitting region and a non-light emitting region. The light emitting region is defined as a region where the light-emitting element 300 included in the display device 1 is disposed and, thus, light in a specific wavelength band is emitted. The non-light emitting region may be defined as a region other than the light emitting region, that is, a region where the light-emitting element 300 is not disposed and thus light is not emitted.

The sub pixel PX1, PX2, PX3 of the display device 1 may include a plurality of banks 41, 42, 43, a plurality of electrodes 21 and 22, and the light-emitting elements 300.

The plurality of electrodes 21 and 22 may be electrically connected to the light-emitting elements 300 and may receive a voltage (e.g., a predetermined voltage) such that the light-emitting elements 300 emit light. Further, at least a part of each of the electrodes 21 and 22 may be used to form an electric field in the sub pixel PX1, PX2, PX3 to align the light-emitting elements 300.

In an embodiment, the plurality of electrodes 21 and 22 may include a first electrode 21 and a second electrode 22. In an embodiment, the first electrode 21 may be a pixel electrode separated for each sub pixel PX1, PX2, PX3, and the second electrode 22 may be a common electrode commonly connected along each sub pixel PX1, PX2 PX3. One of the first electrode 21 and the second electrode 22 may be an anode of the light-emitting element 300, and the other may be a cathode of the light-emitting element 300. However, the present invention is not limited thereto, and the opposite may be the case.

The first electrode 21 and the second electrode 22 may respectively include electrode stem portions 21S and 22S disposed to extend in a first direction D1 and at least one electrode branch portions 21B and 22B respectively extending and branching from the electrode stem portions 21S and 22S in a second direction D2 which is a direction intersecting the first direction D1.

The first electrode 21 may include a first electrode stem portion 21S extending in the first direction D1 and at least one first electrode branch portion 21B branched from the first electrode stem portion 21S and extending in the second direction D2.

The first electrode stem portion 21S of an arbitrary pixel may have both ends spaced apart and terminated between each sub pixel PX1, PX2, PX3 and may be disposed in substantially a same straight line as the first electrode stem portion 21S of neighboring sub pixels belonging to the same row (for example, adjacent to each other in the first direction D1). Accordingly, the first electrode stem portions 21S disposed in the sub pixels PX1, PX2, PX3 may respectively apply different electrical signals to the first electrode branch portions 21B, and each of the first electrode branch portions 21B may be separately driven.

The first electrode branch portion 21B may be branched from at least a part of the first electrode stem portion 21S, may be disposed to extend in the second direction D2, and may be terminated in a state of being spaced apart from the electrode stem portion 22S disposed opposite the first electrode stem portion 21S.

The second electrode 22 may include a second electrode stem portion 22S extending in the first direction D1 and disposed to be spaced apart from and to face the first electrode stem portion 21S, and a second electrode branch portion 22B branched from the second electrode stem portion 22S and disposed to extend in the second direction D2. However, the second electrode stem portion 22S may extend along the plurality of sub pixels PX1, PX2, PX3, of which other end portions are adjacent in the first direction D1. Accordingly, both ends of the second electrode stem portion 22S of an arbitrary pixel may be connected to the second electrode stem portion 22S of a neighboring pixel between the pixels PX.

The second electrode branch portion 22B may be spaced apart from and face the first electrode branch portion 21B, and may be terminated in a state of being spaced apart from the first electrode stem portion 21S. That is, in the second electrode branch portion 22B, one end portion may be connected to the second electrode stem portion 22S, and the other end portion may be disposed in the sub pixel PX1, PX2, PX3 in a state of being spaced apart from the first electrode stem portion 21S.

The drawings illustrate that two first electrode branch portions 21B are disposed, and the second electrode branch portion 22B is disposed between the two first electrode branch portions 21B, but the present invention is not limited thereto.

The plurality of banks 41, 42, 43 may include a third bank 43 disposed at a boundary between the sub-pixels PX1, PX2, PX3, and a first bank 41 and a second bank 42 respectively disposed under the electrodes 21 and 22. Although not shown in the drawings, the first bank 41 and the second bank 42 may be respectively disposed under the first electrode branch portion 21B and the second electrode branch portion 22B.

The third bank 43 may be disposed at a boundary between the sub pixels PX1, PX2, PX3. The end portions of the plurality of first electrode stem portions 21S may be spaced apart from each other and terminated based on the third bank 43. The third bank 43 may extend in the second direction D2 and may be disposed at the boundary of the sub pixels PX1, PX2, PX3 arranged in the first direction D1. However, the present invention is not limited thereto, and the third bank 43 may extend in the first direction D1 and may be disposed at the boundary of the sub pixels PX1, PX2, PX3 arranged in the second direction D2. The plurality of sub pixels PX1, PX2, PX3 may be partitioned based on the third bank 43. In an embodiment, the third bank 43 may include a same material as the first bank 41 and the second bank 42 and may be formed in substantially a same process.

Although not shown in the drawings, in each sub pixel PX1, PX2, PX3, a first insulating layer 51 may be disposed to completely cover the sub pixel PX1, PX2, PX3, including the first electrode branch portion 21B and the second electrode branch portion 22B. The first insulating layer 51 may protect the electrodes 21 and 22 and insulate the electrodes 21 and 22 from each other such that the electrodes 21 and 22 do not come into direct contact with each other.

The plurality of light-emitting elements 300 may be aligned between the first electrode branch portion 21B and the second electrode branch portion 22B. At least some of the plurality of light-emitting elements 300 may have first ends electrically connected to the first electrode branch portion 21B, and second ends electrically connected to the second electrode branch portion 22B.

The plurality of light-emitting elements 300 may be spaced apart from each other in the second direction D2 and may be aligned substantially parallel to each other. An interval at which the light-emitting elements 300 are spaced apart from each other is not particularly limited. In some cases, a plurality of the light-emitting elements 300 may be disposed adjacent to each other to form a group, and other light-emitting elements 300 may form a group in a state of being spaced apart from each other at an interval (e.g., a predetermined interval), may have non-uniform density, and may be oriented to be aligned in one direction.

A contact electrode 26 may be disposed on each of the first electrode branch portion 21B and the second electrode branch portion 22B. However, the contact electrodes 26 may be substantially disposed on the first insulating layer 51, and at least portions of the contact electrode 26 may come into contact with or may be electrically connected to the first electrode branch portion 21B and the second electrode branch portion 22B.

A plurality of contact electrodes 26 may be disposed to extend in the second direction D2, and may be disposed to be spaced apart from each other in the first direction D1. The contact electrodes 26 may contact at least first end portions of the light-emitting elements 300, and the contact electrode 26 may come into contact with the first electrode 21 or the second electrode 22 to receive electrical signals. Accordingly, the contact electrodes 26 may transmit the electrical signal received from each of the electrodes 21 and 22 to the light-emitting elements 300.

The contact electrodes 26 may include a first contact electrode 26a and a second contact electrode 26b. The first contact electrode 26a may be disposed on the first electrode branch portion 21B, and may come into contact with the first end portion of the light-emitting element 300, and the second contact electrode 26b may be disposed on the second electrode branch portion 22B, and may come into contact with the second end portion of the light-emitting element 300.

The first electrode stem portion 21S and the second electrode stem portion 22S may be electrically connected to a circuit element layer of the display device 1 through contact holes, for example, a first electrode contact hole CNTD and a second electrode contact hole CNTS. The drawings illustrate that one second electrode contact hole CNTS is formed in the second electrode stem portions 22S of the plurality of sub pixels PX1, PX2 PX3. However, the present invention is not limited thereto, and, in some cases, the second electrode contact hole CNTS may be formed in each sub pixel PX1, PX2, PX3.

Figure 22:
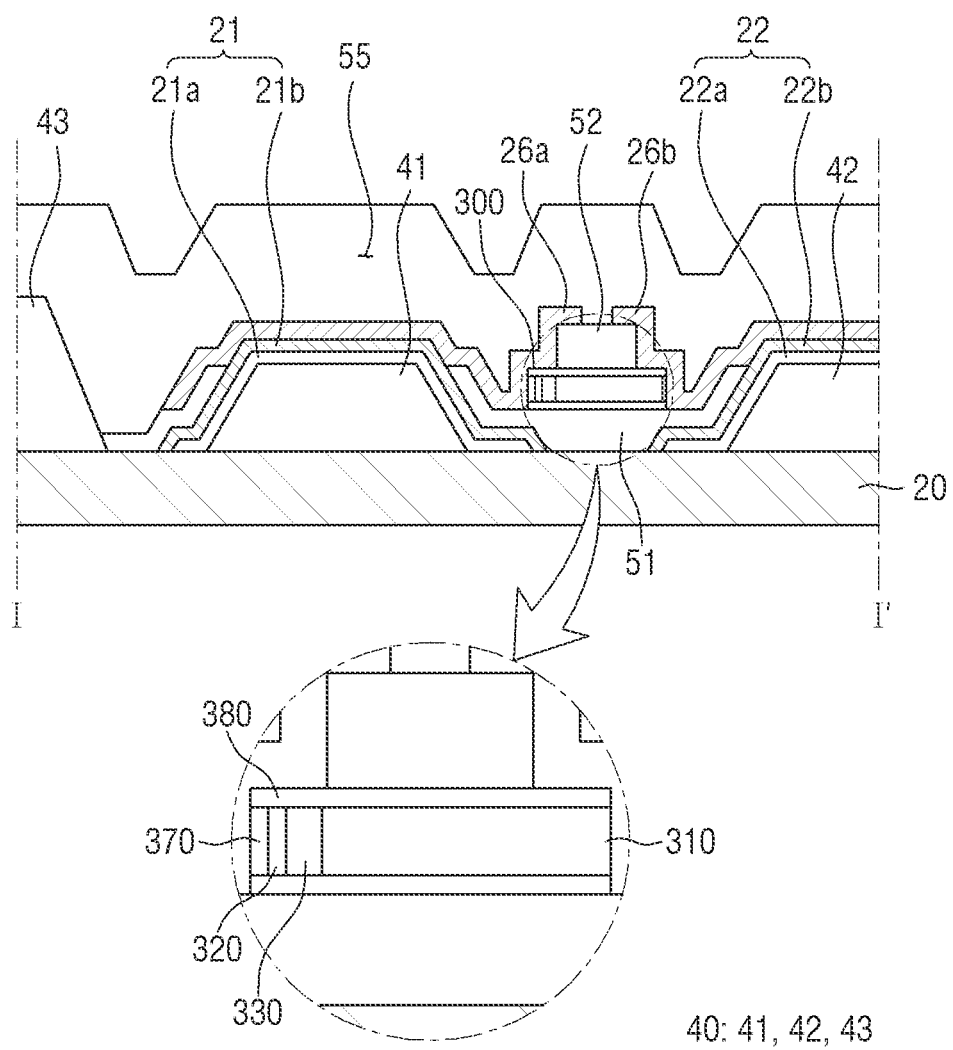
FIG. 22 is a cross-sectional view taken along the line I-I' of FIG. 21.

Further, although not shown in FIG. 21, the display device 1 may include a second insulating layer 52 (shown in FIG. 22) disposed to cover at least portions of the electrodes 21 and 22 and the light-emitting element 300, and a passivation layer 55 (shown in FIG. 22). The disposition and structure thereof will be described later with reference to FIG. 22.

FIG. 22 is a cross-sectional view of a portion of the display device 1 taken along the line I-I' of FIG. 21.

FIG. 22 illustrates a cross-sectional view of the first sub pixel PX1, but may also be applied to other pixels PX or sub pixels. FIG. 22 illustrates a cross-section crossing from one end portion to another end portion of an arbitrary light-emitting element 300.

Although not shown in FIG. 22, the display device 1 may further include a circuit element layer disposed under each of the electrodes 21 and 22. The circuit element layer may include a plurality of semiconductor layers and a plurality of conductive patterns, and thus may include at least one transistor and power line. However, hereinafter, a further detailed description thereof will be omitted.

Referring to FIG. 22, the display device 1 may include a via layer 20, the electrodes 21 and 22 and the light-emitting element 300, which are disposed on the via layer 20, and the like. A circuit element layer (not shown) may be further disposed under the via layer 20. In an embodiment, the via layer 20 may include an organic insulating material to perform a surface planarization function.

A plurality of banks 41, 42, and 43 are disposed on the via layer 20. The plurality of banks 41, 42, and 43 may be disposed to be spaced apart from each other in each sub pixel PX1 PX2, PX3. The plurality of banks 41, 42, and 43 may include a first bank 41 and a second bank 42 disposed adjacent to a center portion of the sub pixel PX1, PX2, PX3, and a third bank 43 disposed at the boundary between the sub pixels PX1, PX2, PX3.

When the display device 1 is manufactured, the third bank 43 has a function of blocking an ink such that the ink does not go over the boundary of the sub pixels PX1, PX2, PX3 when the ink is sprayed using an inkjet printing device. In an embodiment, when the display device 1 further includes another member, the member may be disposed on the third bank 43 and, thus, the third bank 43 may perform a function of supporting the member. However, the present invention is not limited thereto.

The first bank 41 and the second bank 42 are disposed to be spaced apart from and face each other. The first electrode 21 may be disposed on the first bank 41, and the second electrode 22 may be disposed on the second bank 42. In FIGS. 21 and 22, it may be understood that the first electrode branch portion 21B is disposed on the first bank 41, and the second electrode branch portion 22B is disposed on the second bank 42.

In an embodiment, the first bank 41 the second bank 42, and the third bank 43 may be formed in substantially a same process. Accordingly, the banks 41, 42, and 43 may form a single lattice pattern. In an embodiment, the plurality of banks 41, 42, and 43 may include polyimide (PI).

The plurality of banks 41, 42, and 43 may have a structure in which at least a part protrudes based on the via layer 20. In an embodiment, shapes of the protruding banks 41, 42, and 43 are not particularly limited. In an embodiment, as shown in FIG. 22, the first bank 41 and the second bank 42 protrude to a same height, and the third bank 43 may have a shape protruding to a higher position.

Reflective layers 21a and 22a may be respectively disposed on the first bank 41 and the second bank 42, and electrode layers 21b and 22b may be respectively disposed on the reflective layers 21a and 22a. The reflective layers 21a and 22a and the electrode layers 21b and 22b may constitute the electrodes 21 and 22, respectively.

The reflective layers 21a and 22a include a first reflective layer 21a and a second reflective layer 22a. The first reflective layer 21a may cover the first bank 41, and the second reflective layer 22a may cover the second bank 42. Portions of the reflective layers 21a and 22a are electrically connected to the circuit element layer through the contact holes passing through the via layer 20.

The reflective layers 21a and 22a may include a material having high reflectivity to reflect light emitted from the light-emitting element 300. For example, the reflective layers 21a and 22a may include a material such as silver (Ag), copper (Cu), indium tin oxide (ITO), indium zinc oxide (IZO), indium tin-zinc oxide (ITZO), or the like, but are not limited thereto.

The electrode layers 21b and 22b include a first electrode layer 21b and a second electrode layer 22b. In an embodiment, the electrode layers 21b and 22b may have substantially a same pattern as the reflective layers 21a and 22a. The first reflective layer 21a and the first electrode layer 21b are disposed to be spaced apart from the second reflective layer 22a and the second electrode layer 22b.

The electrode layers 21b and 22b include a transparent conductive material such that emitted light emitted from the light-emitting element 300 may be incident on the reflective layers 21a and 22a. For example, the electrode layers 21b and 22b may include materials such as indium tin oxide (ITO), indium zinc oxide (IZO), indium tin-zinc oxide (ITZO), or the like, but are not limited thereto.

In some embodiments, the reflective layers 21a and 22a and the electrode layers 21b and 22b may have a structure in which one or more transparent conductive layers, such as ITO, IZO, and ITZO, and one or more metal layers, such as silver and copper, are stacked. For example, the reflective layers 21a and 22a and the electrode layers 21b and 22b may have a stacked structure of ITO/silver (Ag)/ITO/IZO.

In some embodiments, the first electrode 21 and the second electrode 22 may be formed as a single layer. That is, the reflective layers 21a and 22a and the electrode layers 21b and 22b may be formed as a single layer to transmit electrical signals to the light-emitting element 300 and reflect the light at the same time. In an embodiment, the first electrode 21 and the second electrode 22 may include a conductive material having high reflectivity. For example, the first electrode 21 and the second electrode 22 may be an alloy including aluminum (Al), nickel (Ni), lanthanum (La), or the like. However, the present invention is not limited thereto.

The first insulating layer 51 is disposed to partially cover the first electrode 21 and the second electrode 22. In an embodiment, the first insulating layer 51 may be disposed to cover most of the upper surfaces of the first electrode 21 and the second electrode 22, and may expose portions of the first electrode 21 and the second electrode 22. The first insulating layer 51 may be disposed to partially cover a region where the first electrode 21 and the second electrode 22 are spaced apart from each other, and opposite sides of the region of the first electrode 21 and the second electrode 22.

The first insulating layer 51 is disposed such that the relatively flat upper surfaces of the first electrode 21 and the second electrode 22 are exposed, and the electrodes 21 and 22 are disposed to respectively overlap inclined side surfaces of the first bank 41 and the second bank 42. The first insulating layer 51 has a flat upper surface such that the light-emitting element 300 is disposed, and the upper surface extends in a direction toward the first electrode 21 and the second electrode 22. The extending portion of the first insulating layer 51 is terminated on the inclined side surfaces of the first electrode 21 and the second electrode 22. Accordingly, the contact electrodes 26 may come into contact with the first electrode 21 and the second electrode 22 which are exposed, and may smoothly come into contact with the light-emitting element 300 on the flat upper surface of the first insulating layer 51.

The first insulating layer 51 may protect the first electrode 21 and the second electrode 22 and insulate the first electrode 21 and the second electrode 22 from each other. Further, it is possible to prevent the light-emitting element 300 disposed on the first insulating layer 51 from being damaged due to direct contact with other members.

The light-emitting element 300 may be disposed on the first insulating layer 51. At least one light-emitting element 300 may be disposed on the first insulating layer 51 between the first electrode 21 and the second electrode 22. In the light-emitting element 300, a plurality of layers may be disposed in a direction horizontal to the via layer 20.

The light-emitting element 300 of the display device 1 according to an embodiment may include the above-described conductive semiconductors and active layer, and the conductive semiconductors and the active layer may be sequentially disposed on the via layer 20 in the horizontal direction. As shown in the drawings, in the light-emitting element 300, the first conductive semiconductor 310, the active layer 330, the second conductive semiconductor 320, and the conductive electrode layer 370 may be sequentially disposed on the via layer 20 in the horizontal direction.

However, the present invention is not limited thereto. An order in which the plurality of layers of the light-emitting element 300 are disposed may be an opposite direction, and, in some cases, when the light-emitting element 300 has a different structure, the plurality of layers may be in a direction perpendicular to the via layer 20.

The second insulating layer 52 may be partially disposed on the light-emitting element 300. The second insulating layer 52 may protect the light-emitting element 300 and perform a function of fixing the light-emitting element 300 in a process of manufacturing the display device 1. The second insulating layer 52 may be disposed to surround the outer surface of the light-emitting element 300. That is, some of the materials of the second insulating layer 52 may be disposed between a lower surface of the light-emitting element 300 and the first insulating layer 51. The second insulating layer 52 may have an island shape or a linear shape by extending in the second direction D2 between the first electrode branch portion 21B and the second electrode branch portion 22B in a plan view.

The contact electrodes 26 are disposed on the electrodes 21 and 22 and the second insulating layer 52. The contact electrodes 26 include the first contact electrode 26a disposed on the first electrode 21 and the second contact electrode 26b disposed on the second electrode 22. The first contact electrode 26a and the second contact electrode 26b are disposed to be spaced apart from each other on the second insulating layer 52. Accordingly, the second insulating layer 52 may insulate the first contact electrode 26a and the second contact electrode 26b from each other.

The first contact electrode 26a may come into contact with at least the first electrode 21 exposed due to patterning of the first insulating layer 51 and a first end portion of the light-emitting element 300. The second contact electrode 26b may come into contact with at least the second electrode 22 exposed due to patterning of the first insulating layer 51 and a second end portion of the light-emitting element 300. The first and second contact electrodes 26a and 26b may respectively come into contact with both end side surfaces of the light-emitting element 300, such as the first conductive semiconductor 310, the second conductive semiconductor 320, or the conductive electrode layer 370. As described above, since the first insulating layer 51 has the flat upper surface, the contact electrodes 26 may smoothly come into contact with the side surfaces of the light emitting element 300.

The contact electrodes 26 may include conductive materials. For example, the contact electrodes 26 may include ITO, IZO, ITZO, aluminum (Al), or the like. However, the present invention is not limited thereto.

The passivation layer 55 may be formed on the second insulating layer 52 and the contact electrodes 26 to perform a function of protecting the members disposed on the via layer 20 from an external environment.

Each of the above-described first insulating layer 51, second insulating layer 52, and passivation layer 55 may include an inorganic insulating material or an organic insulating material. In an embodiment, the first insulating layer 51 and the passivation layer 55 may include materials such as silicon oxide ($SiO_x$), silicon nitride ($SiN_x$), silicon oxynitride ($SiO_xN_y$), aluminum oxide ($Al_2O_3$), aluminum nitride (AlN), and the like. The second insulating layer 52 may include a photoresist or the like as the organic insulating material. However, the present invention is not limited thereto.

Hereinafter, a method of manufacturing a light-emitting element 300 according to another embodiment will be described.

Figure 23:
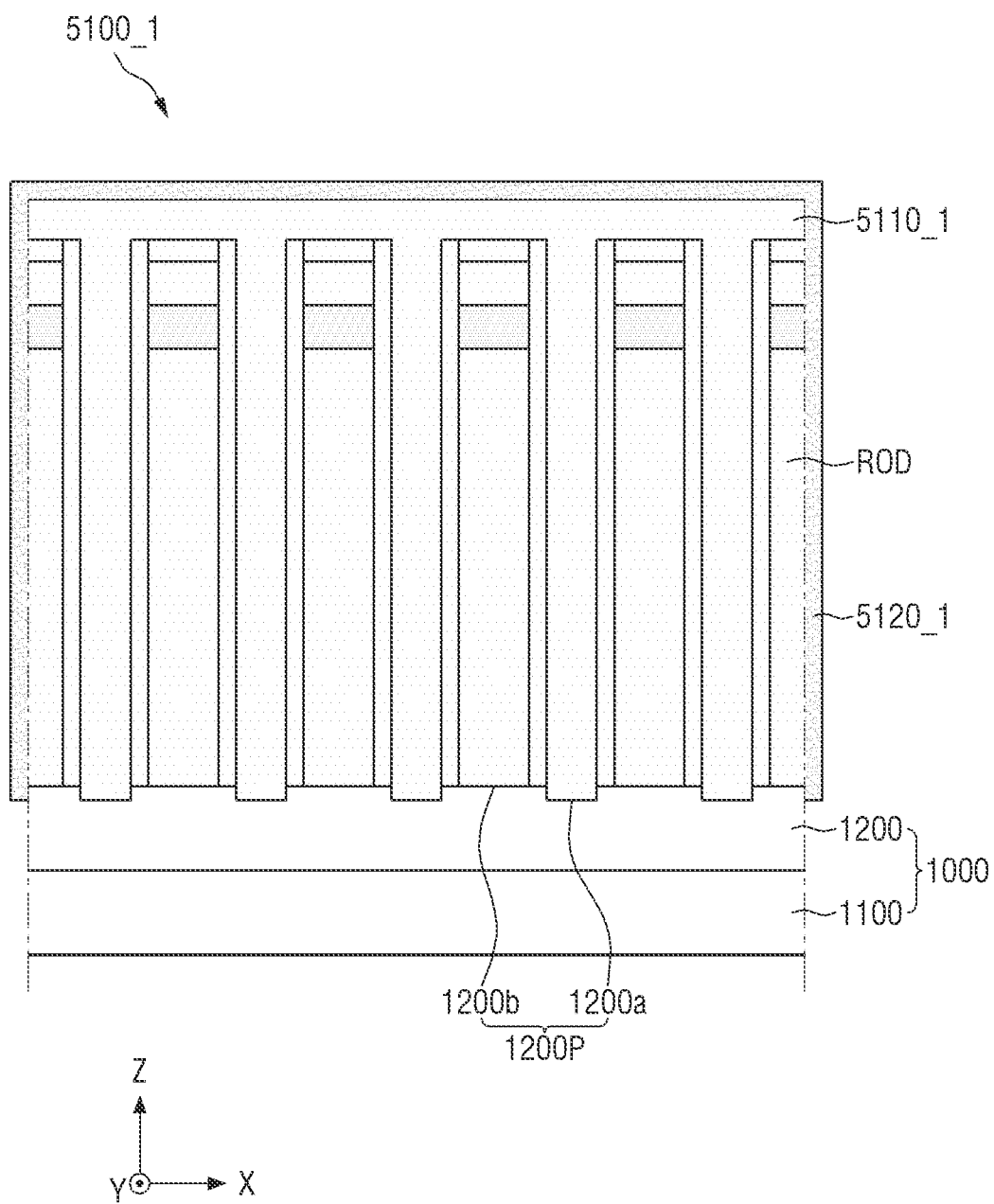
FIG. 23 is a schematic view illustrating a method of manufacturing a light-emitting element according to another embodiment.

FIG. 23 is a schematic view illustrating a first element structure according to another embodiment.

Referring to FIG. 23, a first element structure 5100_1 according to an embodiment may further include a first sub support 5120_1 surrounding an outer surface of a first support 5110_1. The first support 5110_1 is formed to surround semiconductor rods ROD grown on a base substrate 1000 by including a thermosetting resin. The first support 5110_1 includes a material having a relatively high hardness, but when the hardness of the first support 5110_1 is too high, a defect may be formed in the first support 5110_1 when the first support 5110_1 is separated from the base substrate 1000. To prevent or substantially prevent this, the first element structure 5100_1 may further include the first sub support 5120_1 surrounding an outer surface of the first support 5110_1. In an embodiment, the first sub support 5120_1 may include a thermoplastic resin or a flexible film. For example, the first sub support 5120_1 may include a same material as the second support 5210, but is not limited thereto.

The first sub support 5120_1 may prevent or substantially prevent damage to the first support 5110_1 when the first element structure 5100_1 is separated from the base substrate 1000. Accordingly, even when the first support 5110_1 includes a thermosetting resin and has a relatively high hardness, damage to the first support 5110_1 with the semiconductor rod ROD when the first element structure 5100_1 is separated from the base substrate 1000 may be prevented or substantially prevented.

As described above, the light-emitting element 300 may further include a conductive electrode layer disposed on a surface of the first conductive semiconductor 310, for example, a lower surface of the first conductive semiconductor 310 based on FIG. 1. According to an embodiment, the conductive electrode layer disposed on the lower surface of the first conductive semiconductor 310 may be formed after a step of partially etching the first element structure 5100.

Figure 24:
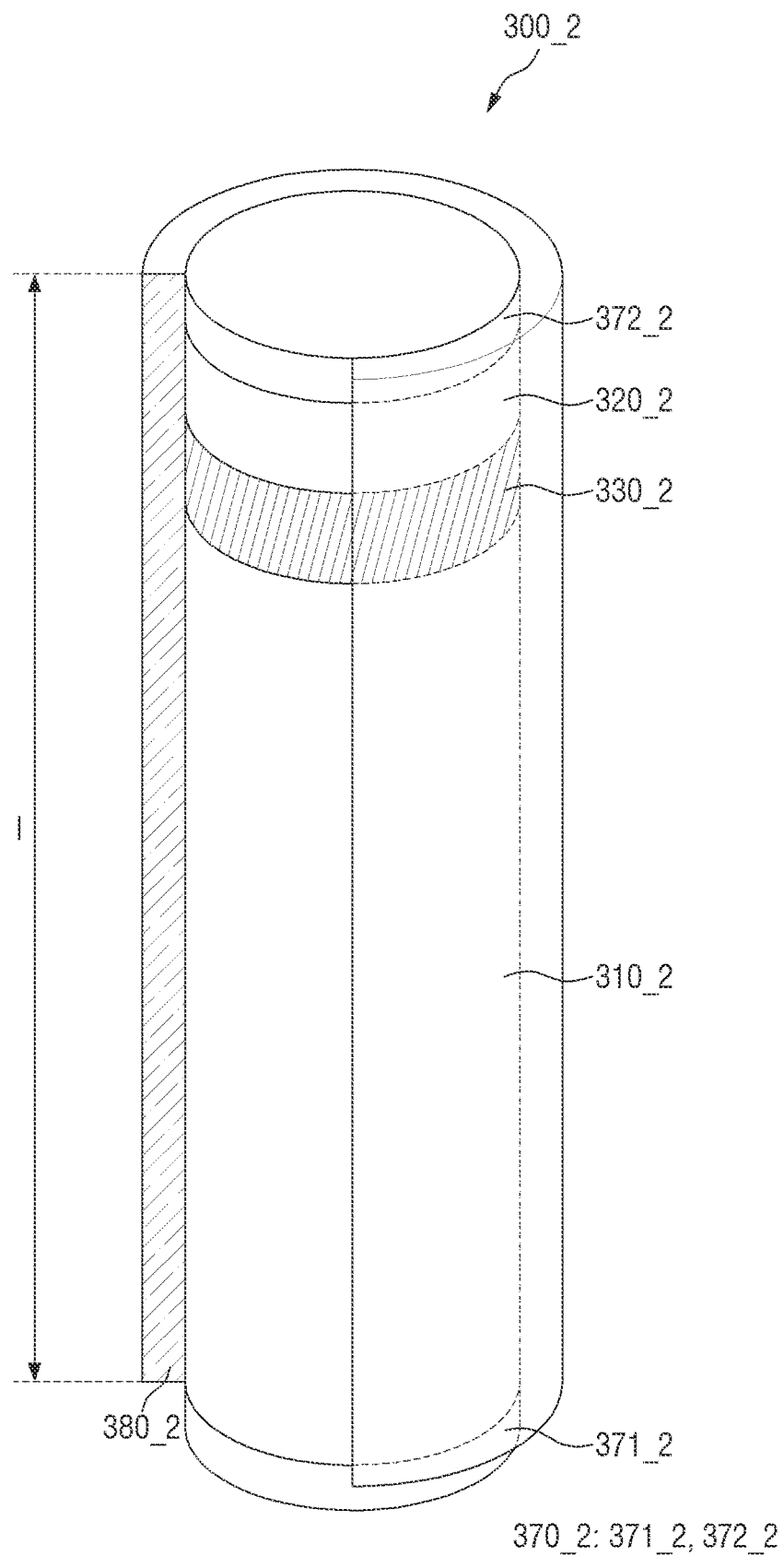
FIG. 24 is a schematic view of a light-emitting element according to another embodiment.

FIG. 24 is a schematic view of a light-emitting element according to another embodiment.

Referring to FIG. 24, as described above, a light-emitting element 300_2 according to an embodiment may include a larger number of conductive electrode layers. The light-emitting element 300_2 may include a first conductive electrode layer 371_2 disposed on a surface of a first conductive semiconductor 310_2, for example, a lower surface in the drawing, and a second conductive electrode layer 372_2 disposed on a second conductive semiconductor 320_2.

It may be understood that the second conductive electrode layer 372_2 corresponds to the conductive electrode layer 370 included in the light-emitting element 300 in FIG. 1, and the light-emitting element 300_2 in FIG. 24 further includes the first conductive electrode layer 371_2 compared to the light-emitting element 300 in FIG. 1. For example, the first conductive electrode layer 371_2 may be doped with a first conductivity type, and the second conductive electrode layer 372_2 may be doped with a second conductivity type. However, the present invention is not limited thereto. The light-emitting element 300_2 in FIG. 24 may be the same as the light-emitting element 300 in FIG. 1 except for further including the first conductive electrode layer 371_2. Further detailed descriptions of other members will be omitted.

As described above, when the light-emitting element 300 is manufactured, the semiconductor structure 3000 in which the first conductive semiconductor layer 3100 to the conductive electrode material layer 3700 are sequentially formed may be prepared on the base substrate 1000. Here, the light-emitting element 300_2 in FIG. 24 may be manufactured by further forming the conductive electrode material layer 3700 between the first conductive semiconductor layer 3100 and the buffer material layer 1200. However, the present invention is not limited thereto, and when the light-emitting element 300 is manufactured, the conductive electrode material layer 3700 may be formed before the second element structure 5200 is formed. A method of forming the light emitting device 300_2 in FIG. 24 will be described in further detail with reference to FIGS. 25 to 27.

Figure 25:
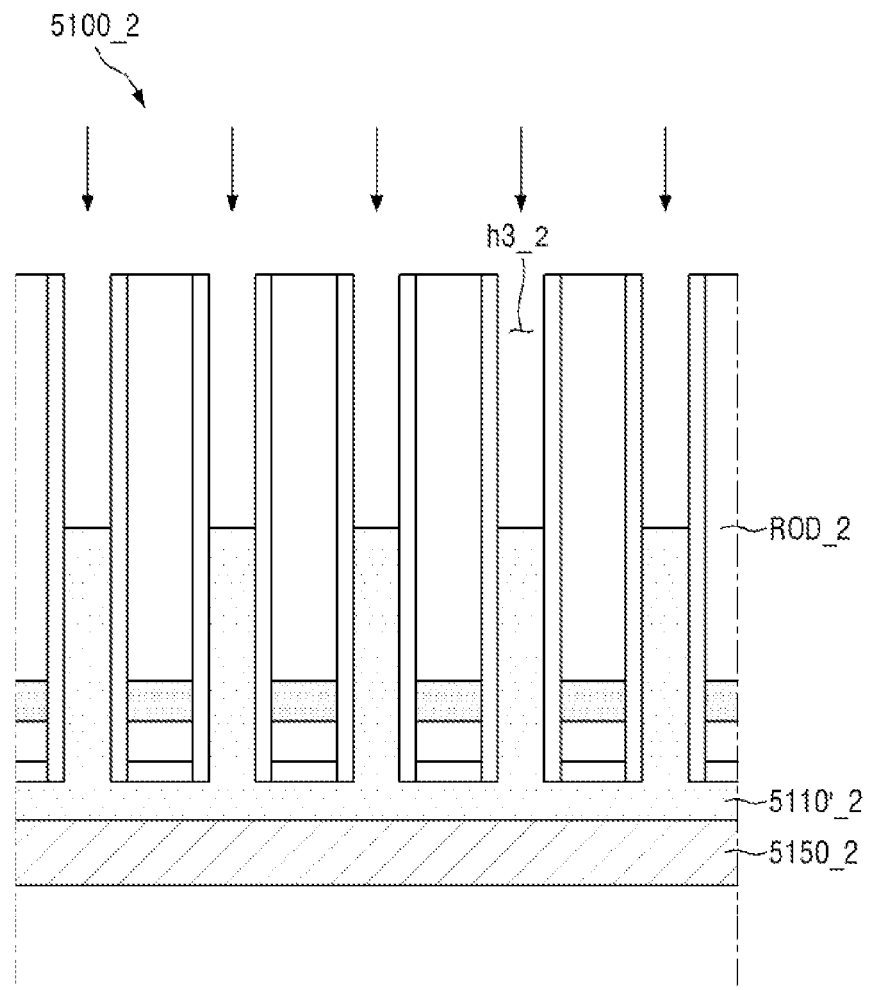
FIGS. 25 to 27 are schematic views illustrating a method of manufacturing a light-emitting element according to another embodiment.
Figure 26:
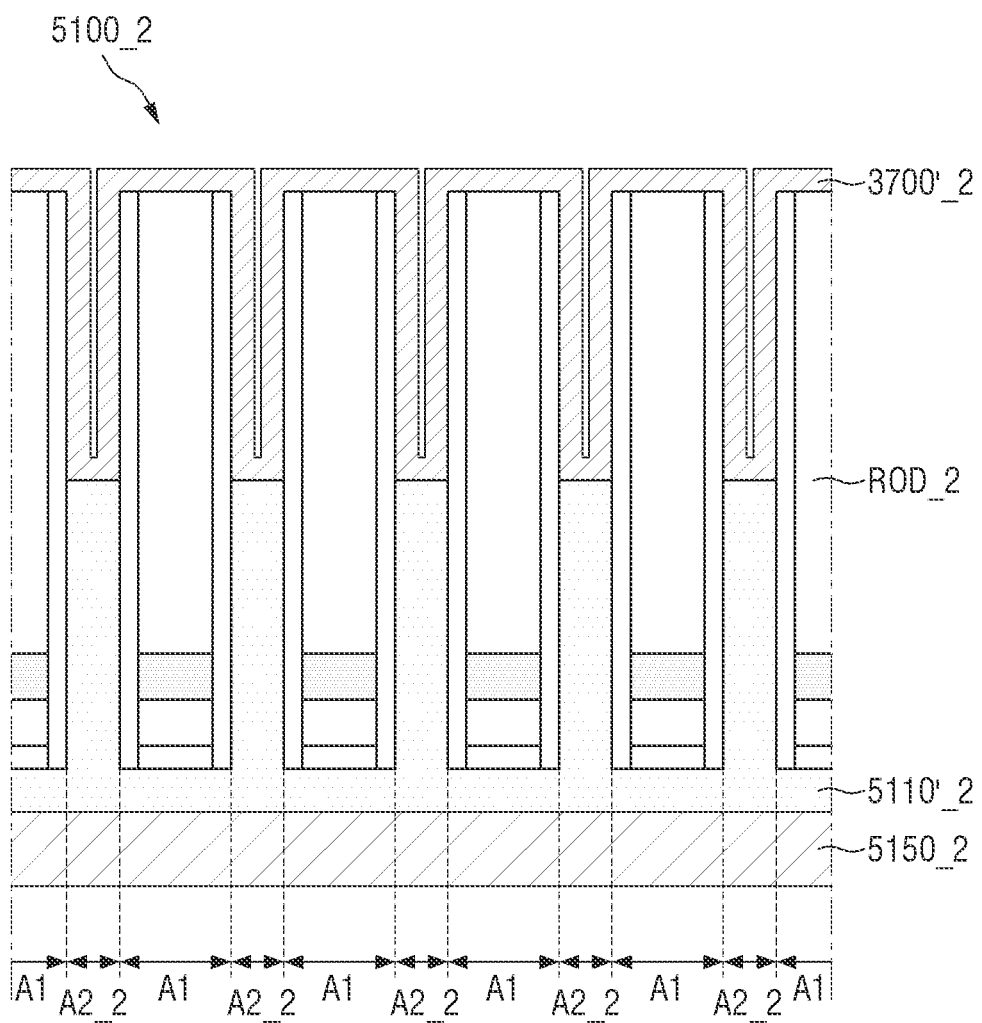
Figure 27:
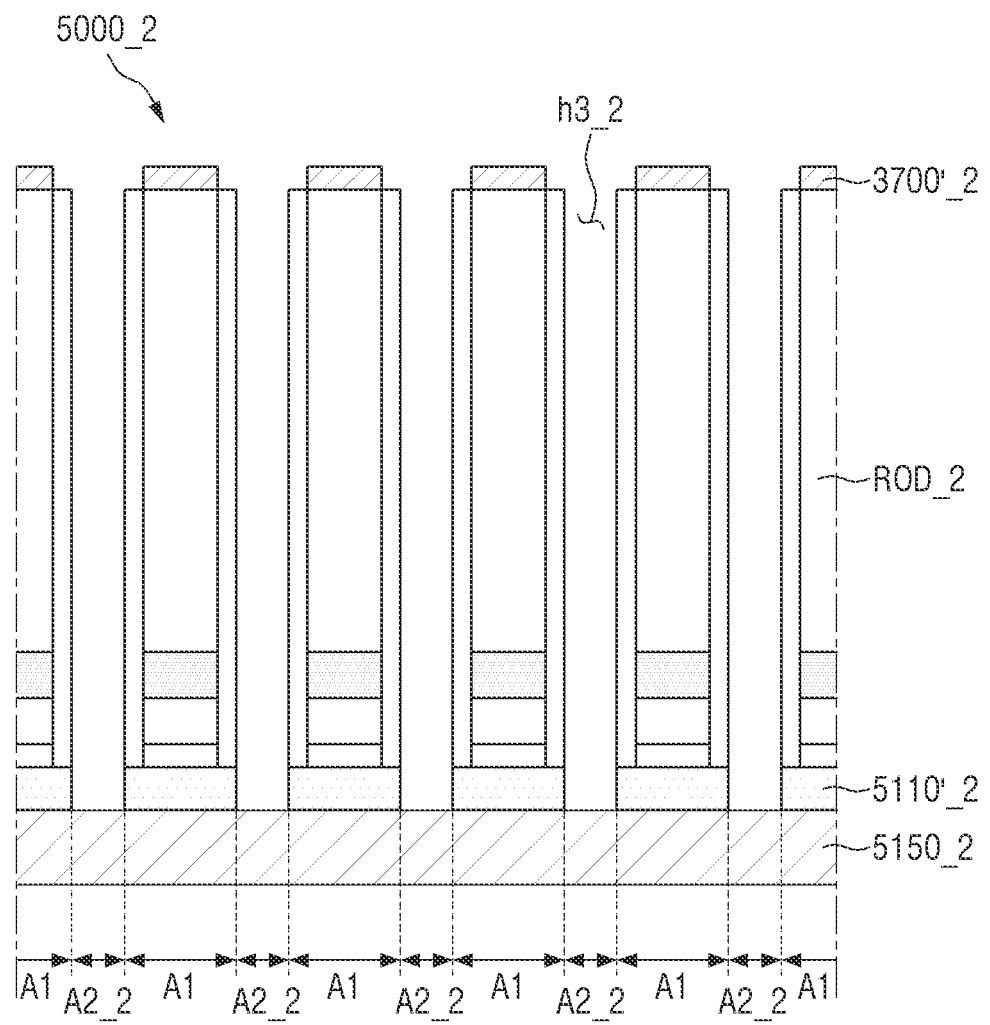

FIGS. 25 to 27 are schematic views illustrating a method of manufacturing a light-emitting element according to another embodiment.

Referring to FIGS. 25 to 27, a method of manufacturing the light-emitting element 300_2 according to an embodiment may include a step of partially removing the first support 5110 in the second region A2 in the step of forming the second element structure 5200, and then forming a conductive electrode material layer 3700'_2 disposed on an exposed end portion of a semiconductor rod ROD_2 and a first support 5110'_2 remaining in the second region A2. The conductive electrode material layer 3700'_2 disposed on the exposed end portion of the semiconductor rod ROD_2 may constitute the first conductive electrode layer 371_2 included in the light emitting device 300_2 in FIG. 24.

As shown in FIG. 25, in a first element structure 5100_2, a first support 5110'_2 on an auxiliary layer 5150_2 in a second region A2 is partially removed, and, thus, one end portion and a side surface of the semiconductor rod ROD_2 are partially exposed. In a step of forming a third hole h3_2 by etching the first support 5110'_2 in the second region A2 in a direction, a depth of the third hole h3_2 may expose the side surface of the semiconductor rod ROD_2, and may be smaller than a thickness dd of the first support 5110'_2. Accordingly, even when the third hole h3_2 is formed, a portion of the first support 5110'_2 in the second region A2 may remain.

Subsequently, as shown in FIG. 26, a conductive electrode material layer 3700'_2 is formed on an end portion of the semiconductor rod ROD_2, the side surface of the semiconductor rod ROD_2 exposed along the third hole h3_2, and the first support 5110'_2. In an embodiment, the conductive electrode material layer 3700'_2 may include substantially a same material as the first conductive electrode layer 371_2 in FIG. 24. Further detailed descriptions of the above will be omitted.

The conductive electrode material layer 3700'_2 is disposed on an end portion of the semiconductor rod ROD_2, that is, on the exposed first conductive semiconductor layer 3100. In a step which will described later, the conductive electrode material layer 3700'_2 may be partially removed, and the first conductive electrode layer 371_2 may be formed on the first conductive semiconductor layer 3100.

Subsequently, as shown in FIG. 27, the first support 5110_2 and the conductive electrode material layer 3700'_2 are etched in a direction along the third hole h3_2. The third hole h3_2 is formed such that the first support 5110_2 in the second region A2 is removed, and the side surface of the semiconductor rod ROD_2 is exposed. In the semiconductor rod ROD_2 in FIG. 27, the conductive electrode material layers 3700 and 3700'_2 are formed at both end portions, and the conductive electrode material layers 3700'_2 and 3700 may respectively constitute the first conductive electrode layer 371_2 and the second conductive electrode layer 372_2 in the light-emitting element 300_2 manufactured by performing a following process. The light emitting device 300_2 in FIG. 24 may be manufactured by partially etching the first support 5110'_2 in the second region A2 and forming the conductive electrode material layer 3700'_2 in the exposed region. Since a step of forming the second support 5210 and separating the semiconductor rod ROD from the second element structure 5200 may be the same as above, further detailed descriptions will be omitted.

In concluding the detailed description, those skilled in the art will appreciate that many variations and modifications can be made to the described embodiments without departing from the principles of the present invention. Therefore, the disclosed embodiments of the invention are provided in a generic and descriptive sense and not for purposes of limitation.

The invention claimed is:

1. A method of manufacturing a light-emitting element, the method comprising:
    preparing a base substrate and a plurality of semiconductor rods arranged on the base substrate;
    a first separating comprising forming a first element structure including a semiconductor rod of the plurality of semiconductor rods and a first support formed around an outer surface of the semiconductor rod, and separating the first element structure from the base substrate, wherein the first support fills a first space between adjacent ones of the plurality of semiconductor rods and connects the adjacent ones of the plurality of semiconductor rods to each other;
    removing at least a part of the first support filling the first space so as to partially expose the semiconductor rods, and forming a second element structure including the exposed semiconductor rods and a second support around an outer surface of the first support, the second support filling at least a part of the first space from which the first support is removed; and
    a second separating comprising separating the semiconductor rods from the second support.

2. The method of claim 1, wherein each of the plurality of the semiconductor rods has a shape in which a first end portion thereof contacts the base substrate, and a second end portion thereof extends in a first direction perpendicular to the base substrate.

3. The method of claim 2, wherein the first support has an extending thickness in the first direction greater than an extending length of the semiconductor rods in the first direction, and is formed to cover the second end portion of the semiconductor rods.

4. The method of claim 3, wherein, in the first separating, the first element structure includes a pattern portion formed in a surface separated from the base substrate and having at least a partial recessed region, and each of the plurality of the semiconductor rods has the first end portion exposed at the pattern portion.

5. The method of claim 3, wherein the first support includes a first region defined as a region overlapping the semiconductor rods in the first direction and a second region defined as a region other than the first region.

6. The method of claim 5, wherein the forming the second element structure comprises etching at least a part of the first support formed in the second region in the first direction to form a hole, and forming the second support partially surrounding the first support and the semiconductor rods exposed along the hole.

7. The method of claim 6, wherein:
the hole exposes at least a part of a side surface of each of the plurality of the semiconductor rods; and
a depth of the hole measured in the first direction is less than or equal to the thickness of the first support.

8. The method of claim 7, wherein the second support contacts the first end portion and at least the exposed part of the side surface of each of the plurality of the semiconductor rods.

9. The method of claim 6, wherein the second separating comprises etching the second element structure in a direction perpendicular to the first direction to expose the second end portion of each of the plurality of the semiconductor rods, and removing the second support.

10. The method of claim 9, wherein the removing the second support comprises dissolving the second support in a solvent and volatilizing and removing the dissolved second support.

11. The method of claim 2, wherein the plurality of the semiconductor rods are spaced apart from each other in a second direction different from the first direction.

12. The method of claim 11, wherein the second element structure includes the plurality of semiconductor rods, wherein the semiconductor rods separated from the second element structure satisfy the following Equation 1:

$$0 \leq (\sigma L/L_{mean}) \times 100(\%) \leq 20,$$

where $\sigma L$ is a standard deviation of lengths of light-emitting elements, and $L_{mean}$ is an average of the lengths of the light-emitting elements.

13. The method of claim 1, wherein a hardness of the first support is greater than a hardness of the second support.

14. The method of claim 13, wherein:
the first support includes polydimethylsiloxane (PDMS); and
the second support includes polymethylmethacrylate (PMMA).

15. The method of claim 13, wherein:
the first element structure further includes a first sub support disposed to surround the outer surface of the first support; and
the first sub support includes a thermoplastic resin.

16. The method of claim 15, wherein the first element structure further includes an auxiliary layer on a surface of the first support.

* * * * *